United States Patent
Ide et al.

(10) Patent No.: US 8,653,718 B2
(45) Date of Patent: Feb. 18, 2014

(54) POWER GENERATION UNIT, ELECTRONIC APPARATUS, TRANSPORTATION UNIT, BATTERY, METHOD OF CONTROLLING POWER GENERATION UNIT

(75) Inventors: Noritaka Ide, Shiojiri (JP); Kunio Tabata, Shiojiri (JP); Atsushi Oshima, Shiojiri (JP); Hiroyuki Yoshino, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/464,638

(22) Filed: May 4, 2012

(65) Prior Publication Data
US 2012/0280596 A1 Nov. 8, 2012

(30) Foreign Application Priority Data

May 6, 2011 (JP) ................................. 2011-103446
Oct. 3, 2011 (JP) ................................. 2011-219144
Apr. 27, 2012 (JP) ................................. 2012-102879

(51) Int. Cl.
*H01L 41/08* (2006.01)
(52) U.S. Cl.
USPC ............................ 310/319; 310/329; 310/339
(58) Field of Classification Search
USPC .................... 310/316.01, 31, 7, 319, 329, 339
See application file for complete search history.

(56) References Cited

U.S. PATENT DOCUMENTS

| | | | |
|---|---|---|---|
| 4,327,359 A * | 4/1982 | Kurtz | 340/566 |
| 5,552,656 A | 9/1996 | Taylor | |
| 5,801,475 A | 9/1998 | Kimura | |
| 6,252,336 B1 * | 6/2001 | Hall | 310/339 |
| 6,522,048 B1 | 2/2003 | Burns et al. | |
| 8,026,650 B2 * | 9/2011 | Ramadass et al. | 310/318 |
| 8,368,290 B2 * | 2/2013 | Kwon et al. | 310/339 |
| 8,373,332 B2 | 2/2013 | Lee | |

(Continued)

FOREIGN PATENT DOCUMENTS

| | | |
|---|---|---|
| JP | 07-107752 A | 4/1995 |
| JP | 2005-312269 A | 11/2005 |

(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Mark Budd
(74) *Attorney, Agent, or Firm* — Maschoff Brennan

(57) ABSTRACT

A power generation unit includes: a deformation member which is deformed by switching a deformation direction; a piezoelectric element which is installed to the deformation member; a pair of electrodes which are installed to the piezoelectric element; an inductor which is installed between the pair of the electrodes and which together with a capacitive component of the piezoelectric element constitutes a resonance circuit; a switch which is connected in series to the inductor; a full bridge rectifier which is installed between the pair of the electrodes to rectify an AC current generated by the piezoelectric element; a voltage detection circuit which detects potentials of an anode and cathode of a diode included in the full bridge rectifier; and a controller which allows the switch to be in an ON state for a predetermined time interval based on an output signal of the voltage detection circuit.

12 Claims, 19 Drawing Sheets

(56) References Cited

U.S. PATENT DOCUMENTS

| | | | |
|---|---|---|---|
| 2006/0175931 A1* | 8/2006 | Brantner | 310/319 |
| 2010/0102782 A1* | 4/2010 | Thiesen et al. | 320/166 |
| 2012/0119618 A1* | 5/2012 | Tabata et al. | 310/319 |
| 2012/0126666 A1* | 5/2012 | Tabata et al. | 310/319 |
| 2012/0212101 A1* | 8/2012 | Tabata et al. | 310/319 |
| 2013/0009518 A1* | 1/2013 | Fluhrer et al. | 310/319 |
| 2013/0082570 A1* | 4/2013 | Ide et al. | 310/319 |
| 2013/0082572 A1* | 4/2013 | Oshima et al. | 310/319 |

FOREIGN PATENT DOCUMENTS

| | | |
|---|---|---|
| JP | 4835888 B1 | 12/2011 |
| JP | 4835889 B1 | 12/2011 |
| JP | 2012-152009 A | 8/2012 |
| JP | 2013-081274 A | 5/2013 |
| JP | 2013-081286 A | 5/2013 |

* cited by examiner

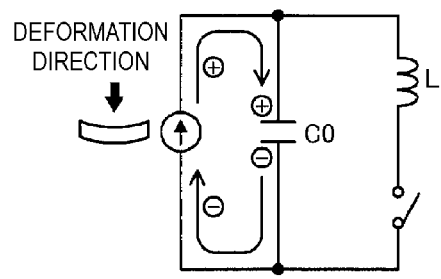
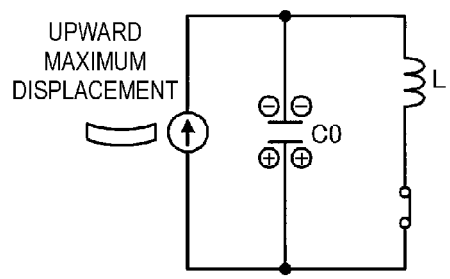
FIG. 3A    FIG. 3F
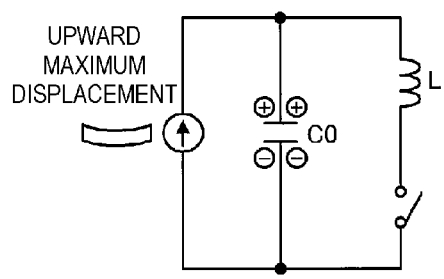
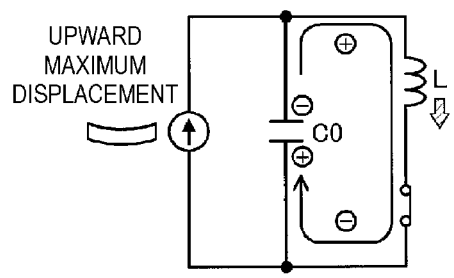
FIG. 3B    FIG. 3E
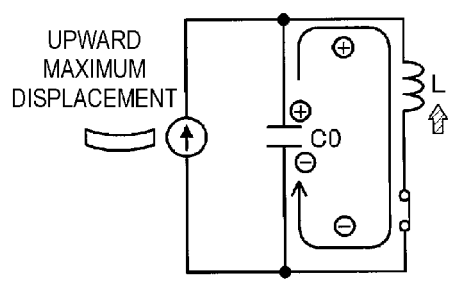
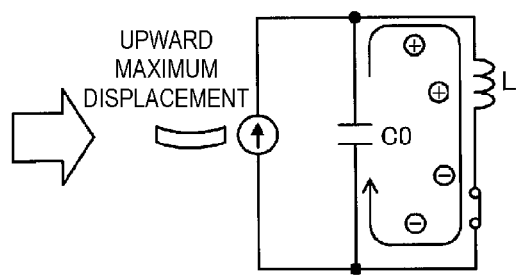
FIG. 3C    FIG. 3D

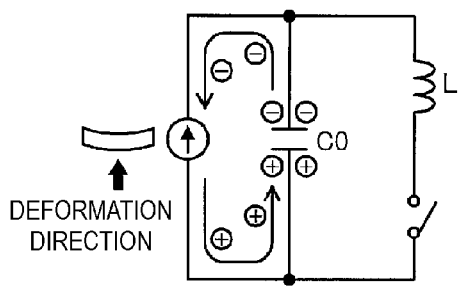
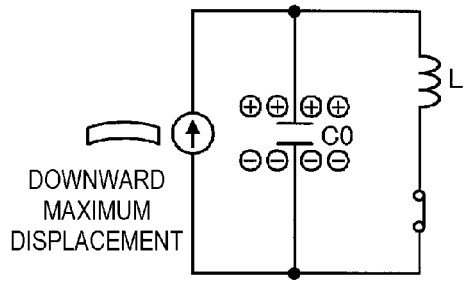
FIG. 4A
FIG. 4F
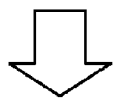
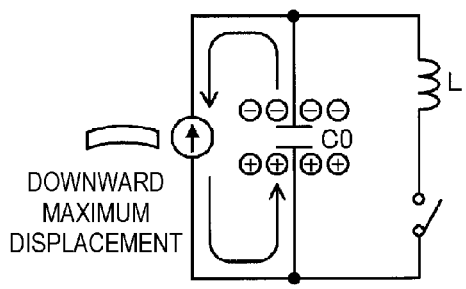
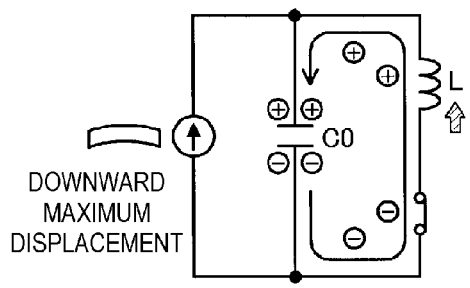
FIG. 4B
FIG. 4E
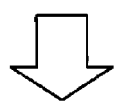
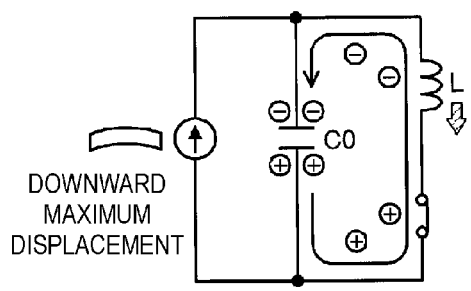
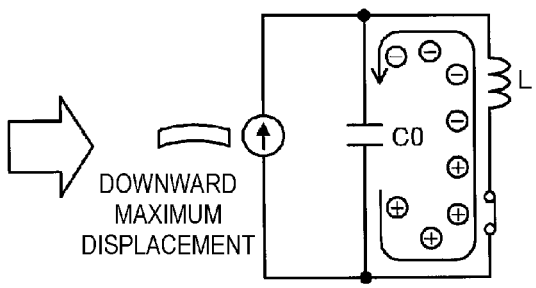
FIG. 4C
FIG. 4D

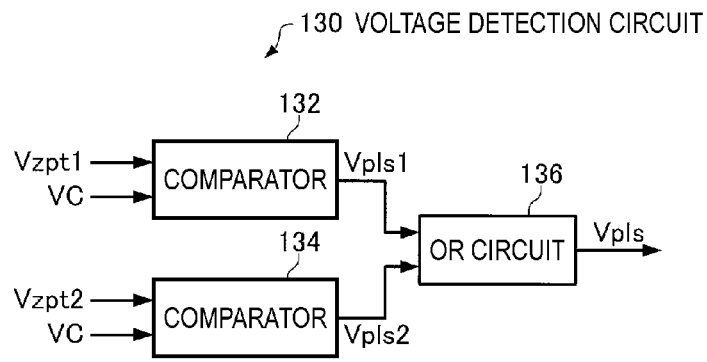
FIG.12
FIG.13A
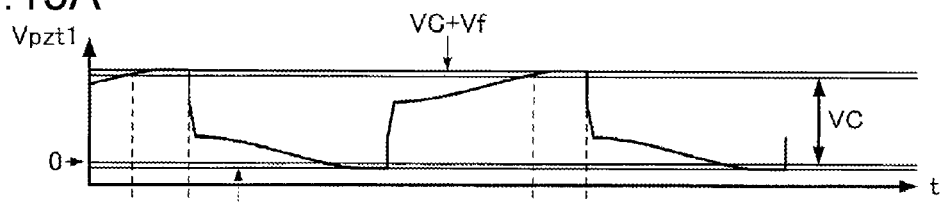
FIG.13B
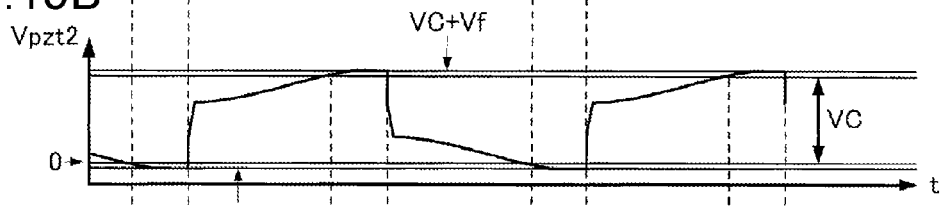
FIG.13C
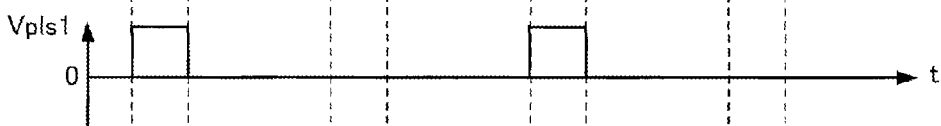
FIG.13D
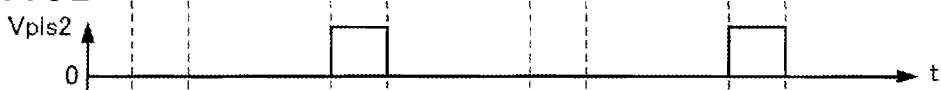
FIG.13E
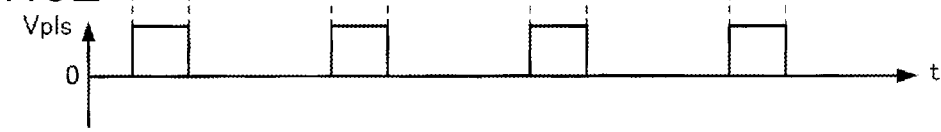

POWER GENERATION UNIT, ELECTRONIC APPARATUS, TRANSPORTATION UNIT, BATTERY, METHOD OF CONTROLLING POWER GENERATION UNIT

TECHNICAL FIELD

Main aspects of the present invention relate to a power generation unit extracting electric charges generated when a piezoelectric element such as a piezoelectric element is deformed as electric energy, an electronic apparatus and transportation unit using the power generation unit, and a method of controlling the power generation unit.

BACKGROUND ART

If a piezoelectric element such as lead zirconate titanate (PZT), quartz ($SiO_2$), or zinc oxide (ZnO) is deformed by an external force, electric polarization is formed in an inner portion of the material, so that positive and negative charges occur on a surface thereof. This phenomenon is called a piezoelectric effect. There have been disclosed power generating methods using this property of the piezoelectric element, where weight is repetitively applied to the piezoelectric element by vibrating a cantilever and charges occurring on the surface of the piezoelectric element are extracted as power.

For example, JP-A-7-107752 discloses a technique where an AC current is generated by vibrating a metal cantilever having a mass installed to a distal end and a thin plate made of a piezoelectric element attached thereto and by extracting positive and negative charges alternately being generated in the piezoelectric element according to the vibration and, after the AC current is rectified by a diode, the current is stored in a capacitor to be extracted as a power. In addition, JP-A-2005-312269 discloses a technique where a contact point is closed only during a time where positive charges are generated by a piezoelectric element, so that a DC current is obtained without occurrence of loss in voltage in a diode. If these techniques are used, a power generation unit can be miniaturized, so that applications such as integration with a small-sized electronic part as a substitute for a battery are expected.

SUMMARY OF THE INVENTION

Problem that the Invention is to Solve

However, in the techniques disclosed in the related art, there is a problem in that a voltage obtained is limited to a voltage generated by the electric polarization of the piezoelectric element. Therefore, in many cases, a separate boosting circuit is necessary in addition to the generating circuit for extracting power from the piezoelectric element. Accordingly, there is a problem in that it is difficult to sufficiently miniaturize the power generation unit.

Some aspects of the invention is made to solve the above-described problems belong to the related arts, and object thereof is to provide a technique capable of generating a high voltage without increasing a size of a power generation unit using a piezoelectric effect of a piezoelectric element.

Means for Solving the Problem (1) An aspect of the invention provides a power generation unit including: a deformation member which is deformed by switching a deformation direction; a piezoelectric element which is installed to the deformation member; a pair of electrodes which are installed to the piezoelectric element; an inductor which is installed between the pair of the electrodes and which together with a capacitive component of the piezoelectric element constitutes a resonance circuit; a switch which is connected in series to the inductor; a rectifier which is installed between the pair of the electrodes to rectify an AC current generated by the piezoelectric element; a voltage detection circuit which detects voltages of an anode and cathode of a diode included in the rectifier; and a controller which allows the switch to be in an ON state for a predetermined time interval based on an output signal of the voltage detection circuit.

According to the aspect of the invention, since the piezoelectric element is installed to the deformation member, the deformation member is deformed, and the piezoelectric element is also deformed. Therefore, positive and negative charges are generated by the piezoelectric effect of the piezoelectric element. In addition, the generating amount of charges is increased in proportion to an increase in the deformation amount of the deformation member (that is, the deformation amount of the piezoelectric element). In addition, since the piezoelectric element may be considered to be a capacitor in terms of an electric circuit, if the switch is connected, a resonance circuit is formed by the piezoelectric element and the inductor, and the charges generated in the piezoelectric element are flowed from the one electrode installed to the piezoelectric element to the inductor. In addition, the current flowed to the inductor overshoots, so that the current is flowed from the other electrode installed to the piezoelectric element into the piezoelectric element. Therefore, the piezoelectric element and the inductor are connected to each other, and after that, if the inductor is disconnected from the piezoelectric element at a predetermined timing, the arrangement of the positive and negative charges generated in the piezoelectric element before the connection of the inductor can be reversed. Next, if the deformation member (piezoelectric element) is deformed in the reverse direction in the state, the charges generated by the piezoelectric effect can be stored in the piezoelectric element. Therefore, the deformation member (piezoelectric element) is repetitively deformed, and the connection and disconnection between the piezoelectric element and the inductor are periodically performed in synchronization with the deformation state (vibration state) of the deformation member, so that it is possible to store the charges in the piezoelectric element.

However, since the arrangement of the positive and negative charges stored in the piezoelectric element is periodically changed according to the deformation (vibration) of the deformation member, the voltage between the pair of the electrodes installed to the piezoelectric element is also periodically changed according to the change. In addition, the current is flowed to the rectifier only for a time interval when the voltage between the pair of the electrodes is higher than the voltage between the two terminals of the load connected through the rectifier, so that the voltage of the anode of a predetermined diode included in the rectifier is higher than the voltage of the cathode. Particularly, according to the aspect of the invention, the switch is allowed to be in the ON state for a predetermined time interval based on the voltages of the anode and cathode of the diode included in the rectifier, so that it is possible to periodically repeat the connection and disconnection of the piezoelectric element and the inductor at an appropriate timing synchronized with the deformation state (vibration state) of the deformation member. Accordingly, it is possible to efficiently store the charges in the piezoelectric element. In addition, since the voltage between the pair of the electrodes installed to the piezoelectric element is also increased in proportion to an increase in the charges stored in the piezoelectric element, it is possible to generate a voltage higher than the voltage generated by the electric polarization of the piezoelectric element without a separate boosting circuit provided. As a result, it is possible to obtain a small-sized power generation unit having good efficiency.

(2) In the power generation unit, the controller may allow the switch to be connected when the voltage of the anode of the diode becomes equal to or lower than the voltage of the cathode after the voltage of the anode of the diode is higher than the voltage of the cathode, and after that, the controller may allow the switch to be disconnected if the predetermined time interval elapses.

The timing when the deformation direction of the deformation member is switched is coincident with the timing when the direction of the current due to the charges generated by the piezoelectric element is switched (the timing when the current becomes zero). In other words, when the deformation direction of the deformation member is switched, the current which has been flowed in the rectifier is not flowed. Therefore, before and after the deformation direction of the deformation member is switched, the voltage is changed from the state where the voltage of the anode of a predetermined diode constituting the rectifier is higher than the voltage of the cathode to the state where the voltage of the anode of the diode is lower than the voltage of the cathode. In addition, at the timing when the deformation direction of the deformation member is switched, since the voltage generated by the piezoelectric element is at a peak, by connecting the switch at this timing to form a resonance circuit, it is possible to efficiently boost the voltage between the pair of the electrodes installed to the piezoelectric element. Therefore, according to the power generation unit, it is possible to improve generating efficiency.

(3) In the power generation unit, the rectifier may be a full bridge rectifier which allows the AC current generated by the piezoelectric element to exclusively be flowed in first and fourth diodes or third and second diodes according to a polarity of the AC current, and the controller may allow the switch to be in the ON state for the predetermined time interval based on voltages of the anode and cathode of the first or fourth diode and voltages of the anode and cathode of the third or second diode.

Since the deformation member (piezoelectric element) is repetitively deformed, an AC current is generated from the pair of the electrodes installed to the piezoelectric element. Therefore, according to the power generation unit, by connecting the full bridge rectifier to the pair of the electrodes, it is possible to efficiently extract energy generated by the piezoelectric element to supply the energy to the load. In addition, the rectifier is configured, so that the connection and disconnection of the switch can be performed every half period of the vibration (deformation) of the deformation member based on the voltages of the anode and cathode of each of the two diodes in which the current is exclusively flowed. Therefore, it is possible to improve the generating efficiency of the piezoelectric element.

(4) In the power generation unit, the controller may allow the switch to be in the ON state by setting a time corresponding to a half period of a resonance period of the resonance circuit as the predetermined time interval.

The time interval from the time when the charges start to be flowed from the one electrode installed to the piezoelectric element to the time when the charge is flowed from the other electrode through the inductor back to the piezoelectric element is a half of the resonance period of the resonance circuit configured with the piezoelectric element and the inductor. Therefore, if the switch is disconnected at the timing when a half of the resonance period elapses after the switch is connected, it is possible to most efficiently reverse the arrangement of the positive and negative charges generated in the piezoelectric element. Therefore, according to the power generation unit, it is possible to achieve the highest generating efficiency.

(5) A power generation unit according to the invention includes: a piezoelectric member which is formed by using a piezoelectric element; a pair of electrodes which are installed in the piezoelectric member; a deformation member which repeatedly deforms the piezoelectric member; an inductor which is installed between the pair of electrodes and which, together with a capacitive component of the piezoelectric member, constitutes a resonance circuit; a switch which is serially connected to the inductor; a rectifier which is connected to the pair of electrodes and which rectifies an AC current generated by the piezoelectric member; a capacitor which stores an output current of the rectifier; a voltage detection unit which detects a voltage of the piezoelectric member; and a controller which determines whether a first voltage detected by the voltage detection unit is a maximum value or a minimum value, wherein in the case where it is determined that the first voltage is a maximum value, and a second voltage detected by the voltage detection unit after the first voltage is detected has decreased from the maximum value to a value which is equal to or higher than a reference voltage, the controller allows the switch to be connected, and wherein in the case in which the first voltage is determined to be a minimum value, and the second voltage detected by the voltage detection unit after detection of the first voltage is increased from the minimum value to a value which is equal to or higher than the reference voltage, the controller allows the switch to be connected.

According to the power generation unit, since the piezoelectric element is installed to the deformation member, if the deformation member is deformed, the piezoelectric element is also deformed. Therefore, positive and negative charges are generated by the piezoelectric effect of the piezoelectric element. In addition, the generating amount of charges is increased in proportion to an increase in the deformation amount of the deformation member (that is, the deformation amount of the piezoelectric element). In addition, since the piezoelectric element may be considered to be a capacitor in terms of an electric circuit, if the switch is connected, a resonance circuit is formed by the piezoelectric element and the inductor, and the charges generated in the piezoelectric element are flowed from the one electrode installed to the piezoelectric element to the inductor. In addition, the current flowed to the inductor overshoots, so that the current is flowed from the other electrode installed to the piezoelectric element into the piezoelectric element. Therefore, the piezoelectric element and the inductor are connected to each other, and after that, if the inductor is disconnected from the piezoelectric element at a predetermined timing, the arrangement of the positive and negative charges generated in the piezoelectric element before the connection of the inductor can be reversed. Next, if the deformation member (piezoelectric element) is deformed in the reverse direction in the state, the charges generated by the piezoelectric effect can be stored in the piezoelectric element. Therefore, the deformation member (piezoelectric element) is repetitively deformed, and the connection and disconnection between the piezoelectric element and the inductor are periodically performed in synchronization with the deformation state (vibration state) of the deformation member, so that it is possible to store the charges in the piezoelectric element.

Since the arrangement of the positive and negative charges stored in the piezoelectric element is periodically changed according to the deformation (vibration) of the deformation member, the voltage between the pair of the electrodes installed to the piezoelectric element is also periodically changed according to the change. The timing when the deformation direction of the deformation member is switched is coincident with the timing when the direction of the current due to the charges generated by the piezoelectric element is switched (the timing when the current becomes zero). In other words, when the deformation direction of the deformation member is switched, the voltage of the piezoelectric element is at maximum or minimum. According to the invention, the controller determines whether the first voltage detected by the voltage detection unit is a maximum value or a minimum value, wherein in the case where it is determined that the first voltage is the maximum value, and the second voltage detected by the voltage detection unit after detection of the first voltage is decreased from the maximum value to a value which is equal to or higher than a reference voltage, the controller allows the switch to be connected, and wherein in the case where it is determined that the first voltage is a minimum value, and the second voltage detected by the voltage detection unit after detection of the first voltage is increased from the minimum value to a value which is equal to or higher than the reference voltage, the controller allows the switch to be connected. Therefore, connection and disconnection between the piezoelectric member and the inductor can be periodically repeated at a time in synchronization with a deformation state (vibration state) of the deformation member. Accordingly, it is possible to efficiently store the charges in the piezoelectric element. In addition, since the voltage between the pair of the electrodes installed to the piezoelectric element is also increased in proportion to an increase in the charges stored in the piezoelectric element, it is possible to generate a voltage higher than the voltage generated by the electric polarization of the piezoelectric element without a separate boosting circuit provided. As a result, it is possible to obtain a small-sized power generation unit having good efficiency.

(6) In the power generation unit, the rectifier may be a full bridge rectifier including a diode, and the reference voltage may be equal to or lower than twice the forward drop voltage value of the diode.

(7) An electronic apparatus according to the invention uses the power generation unit according to above aspects.

(8) A transportation unit according to the invention uses the power generation unit according to above aspects.

(9) The invention is a battery using the power generation unit according to above aspects.

According to the invention, since the power generation unit according to the invention can be assembled into a battery or can be assembled as a substitute for a battery into a small-sized electronic apparatus such as a remote controller, besides the power generated according to the movement of the small-sized electronic apparatus, in the case where the power generation unit according to the invention is used for a transportation unit, for example, an automobile, an electric train, or the like, power can be generated due to the vibration according to the movement, so that it is possible to efficiently supply power to an apparatus included in the transportation unit.

(10) A method of controlling a power generation unit which includes, a deformation member which performs deformation by switching over a direction of deformation; a piezoelectric member which is installed in the deformation member; a pair of electrodes which are installed in the piezoelectric member; an inductor which is installed between the pair of electrodes and which, together with a capacitive component of the piezoelectric member, constitutes a resonance circuit; a switch which is serially connected to the inductor; and a rectifier which rectifies an AC current generated by the piezoelectric member, the method according to the invention includes: detecting anode and cathode potentials of a diode included in the rectifier; and allowing the switch to be in the ON state for a predetermined time interval based on a detection result of the anode and cathode potentials of the diode.

According to the method of controlling the power generation unit, by allowing the switch to be in the ON state for a predetermined time interval based on the potentials of the anode and cathode of the diode included in the rectifier, it is possible to periodically repeat the connection and disconnection of the piezoelectric element and the inductor at an appropriate timing which is synchronized with the deformation state (vibration state) of the deformation member. Accordingly, it is possible to efficiently store the charges in the piezoelectric element. In addition, since the voltage between the pair of the electrodes installed to the piezoelectric element is also increased in proportion to an increase in the charges stored in the piezoelectric element, it is possible to generate a voltage higher than the voltage generated by the electric polarization of the piezoelectric element without a separate boosting circuit provided.

Another power generation unit according to the invention includes: a first electrode; a second electrode; a piezoelectric member which is disposed between the first and second electrodes and which includes a piezoelectric element; a deformation member which applies a mechanical force to the piezoelectric member; an inductor which, together with a capacitive component of the piezoelectric member, constitutes a resonance circuit; a switch which is serially connected to the inductor; a rectifier which is electrically connected to the piezoelectric member and which rectifies an AC current generated by the piezoelectric member; a capacitor which stores an output current of the rectifier; a voltage detection unit which detects a voltage generated by the piezoelectric member; and an inductor which is electrically connected to the first or second electrode.

Preferably, in the power generation unit, the inductor together with a capacitive component of the piezoelectric member constitutes a resonance circuit.

BRIEF DESCRIPTION OF THE DRAWINGS

FIGS. 3A-3F are explanation diagrams conceptually illustrating a first half of operating principles of the power generation unit according to the embodiment.

FIGS. 4A-4F are explanation diagrams conceptually illustrating a second half of the operating principles of the power generation unit according to the embodiment.

FIG. 12 is a diagram illustrating an example of a configuration of a voltage detection circuit.

FIGS. 13A-13E are diagrams illustrating examples of output waveforms of components of the voltage detection circuit.

EMBODIMENT OF THE INVENTION

Hereinafter, exemplary embodiments of the invention will be described in detail with reference to the drawings. In addition, the embodiments described later do not inappropriately limit the invention disclosed in the appended claims. In addition, all the configurations described later are not necessary configurations of the invention.

Hereinafter, in order to clarify the aforementioned invention, the embodiments will be described in the following order.

Figure 1A:
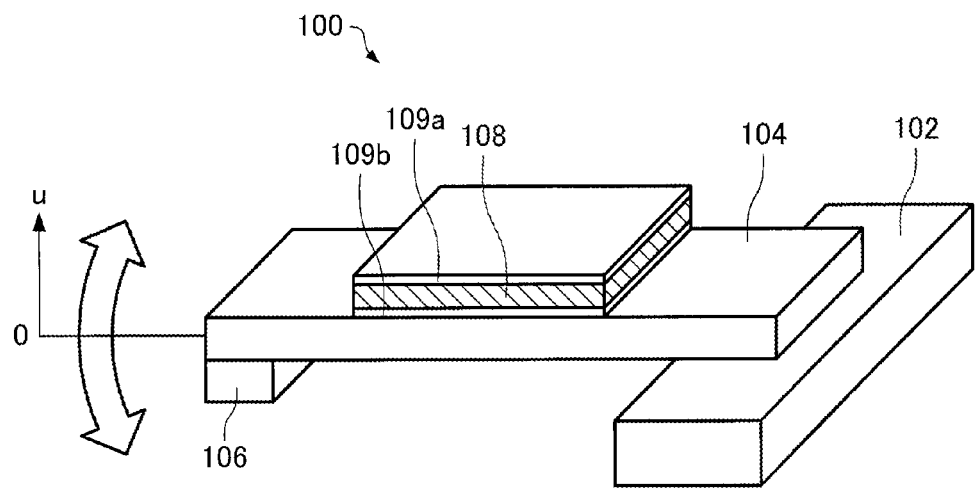
FIG. 1A is an explanation diagram illustrating a structure of a power generation unit according to an embodiment.
Figure 1B:
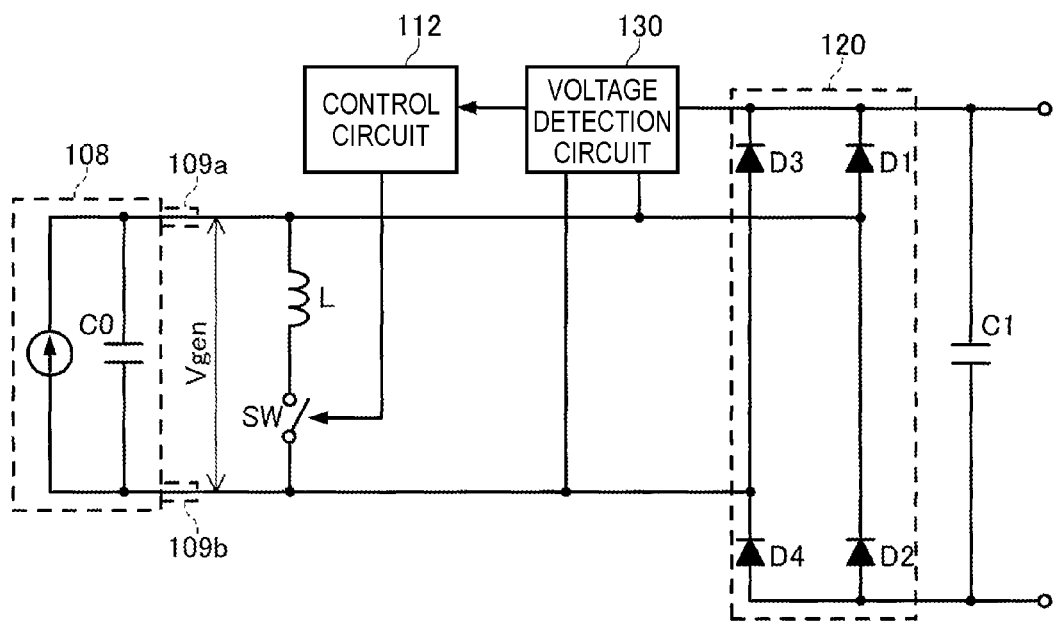
FIG. 1B is an explanation diagram illustrating the structure of the power generation unit according to the embodiment.

A. Structure of Power generation unit
B. Operations of Power generation unit
C. Operating Principles of Power generation unit
D. Switching Timing of Switch
E. Modified Examples
E-1. First Modified Example
E-2. Second Modified Example
E-3. Third Modified Example
E-4. Fourth Modified Example
E-5. Fifth Modified Example
F. Electronic Apparatus, Transportation unit, and Battery A. Structure of Power Generation Unit FIGS. 1A and 1B are explanation diagrams illustrating a structure of a power generation unit 100 according to an embodiment. FIG. 1A illustrates a mechanical structure of the power generation unit 100, and FIG. 1B illustrates an electrical structure thereof. The mechanical structure of the power generation unit 100 according to the embodiment is a cantilever structure where the base end side of a beam 104 with a mass 106 attached to the distal end thereof is fixed to a supporting end 102, and the supporting end 102 is preferably fixed within the power generation unit 100. In addition, a piezoelectric element 108 formed with a piezoelectric element such as lead zirconate titanate (PZT) is attached on a surface of the beam 104, and a first electrode (upper electrode) 109*a* and a second electrode (lower electrode) 109*b* which are formed with a metal thin film are attached on the front side and the rear side of a surface of the piezoelectric element 108. In addition, although the piezoelectric element 108 is attached on an upper surface side of the beam 104 in the example illustrated in FIG. 1A, the piezoelectric element 108 may be attached on a lower surface side of the beam 104, or the piezoelectric element 108 may be attached on the upper and lower surface sides of the beam 104.

Since the base end side of the beam 104 is fixed to the supporting end 102 and the mass 106 is attached to the distal end side thereof, if vibration or the like is exerted, the distal end of the beam 104 is greatly vibrated as illustrated by a white outlined arrow in this figure. As a result, a compressive force and a tensile force are alternately exerted to the piezoelectric element 108 attached on the surface of the beam 104. Then, positive and negative charges are generated by the piezoelectric effect of the piezoelectric element 108, and the charges occur in the first electrode 109*a* and the second electrode 109*b*. In addition, with respect to the mass 106, it is preferable that the distal and base end sides of the beam 104 are unbalanced in weight, although it is not essential. This is because, for example, repetition of displacement of the beam 104 is easily obtained from one vibration due to unbalance in weight. In addition, the beam 104 corresponds to a "deformation member" according to the invention.

FIG. 1B illustrates a circuit diagram of the power generation unit 100 according to the embodiment. The piezoelectric element 108 may be electrically represented by a current source and a capacitor (capacitive component) C0 storing charges. An inductor L is connected in parallel to the piezoelectric element 108, and the inductor L and the capacitive component of the piezoelectric element 108 constitute an electrical resonance circuit. And, a switch SW for turning ON/OFF the resonance circuit is connected in series to the inductor L.

In addition, the first electrode 109*a* and the second electrode 109*b* installed in the piezoelectric element 108 are connected to a full bridge rectifier 120 configured by four diodes D1 to D4. An AC current generated from the piezoelectric element 108 is exclusively flowed to the diodes D1 and D4 (first and fourth diodes) or to the diodes D3 and D2 (third and second diodes) according to the polarity of the AC current. In addition, a capacitor (output capacitor) C1 storing rectified current is connected to the full bridge rectifier 120 so as to drive the electric load.

A voltage detection circuit 130 compares an anode potential of the diode D1 with a cathode potential thereof and compares an anode potential of the diode D3 with a cathode potential thereof. And, the voltage detection circuit 130 outputs a signal indicating a time interval when the anode potential of the diode D1 is higher than the cathode potential thereof or when the anode potential of the diode D3 is higher than the cathode potential.

A control circuit 112 controls turning ON/OFF of the switch SW based on an output signal of the voltage detection circuit 130. More specifically, when the potential of the anode of the diode D1 is changed from a state where the anode potential is higher than the potential of the cathode to a state where the anode potential is lower than the cathode potential, or when the potential of the anode of the diode D3 is changed from a state where the anode potential is higher than the potential of the cathode to a state where the anode potential is lower than the cathode potential, the control circuit 112 turns ON the switch SW, and after a predetermined time interval elapses, the control circuit 112 turns OFF the switch SW.

B. Operations of Power Generation Unit

Figure 2A:
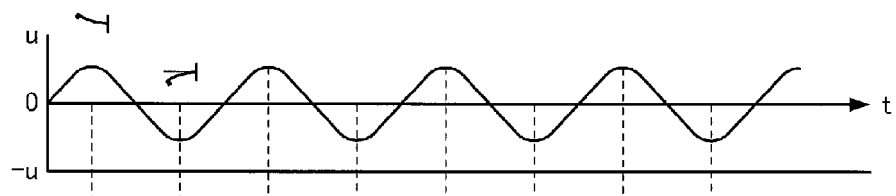
FIGS. 2A-2D are explanation diagrams illustrating operations of the power generation unit according to the embodiment.
Figure 2B:
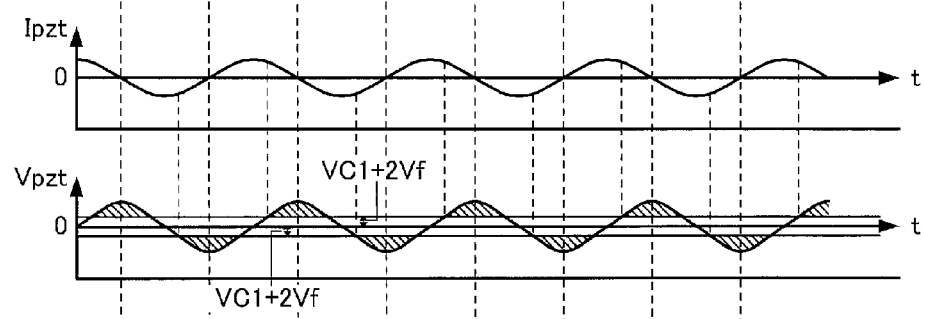

FIGS. 2A-2D are explanation diagrams illustrating operations of the power generation unit 100 according to the embodiment. FIG. 2(a) illustrates a situation where a displacement u of the distal end of the beam 104 is changed according to vibration of the beam 104. Furthermore, the plus displacement u indicates a state where the beam 104 is bent upwards (a state where the upper surface side of the beam 104 becomes concave), and the minus displacement (−u) indicates a state where the beam 104 is bent downwards (a state where the lower surface side of the beam 104 becomes concave). In addition, FIG. 2(b) illustrates a situation of a current generated by the piezoelectric element 108 according to the deformation of the beam 104 and an electromotive force generated in an inner portion of the piezoelectric element 108 as a result thereof. Furthermore, in FIG. 2(b), the situation where the piezoelectric element 108 generates charges is illustrated by a charge amount generated per unit time (that is, a current Ipzt), and the electromotive force generated in the piezoelectric element 108 is illustrated by a potential difference Vpzt generated between the first electrode 109a and the second electrode 109b.

As illustrated in FIGS. 2(a) and 2(b), while the displacement of the beam 104 is increased, the piezoelectric element 108 generates a positive-direction current (that is, a current Ipzt having a plus value), and accordingly, the potential difference Vpzt between the first electrode 109a and the second electrode 109b is increased in the positive direction. If the positive-direction potential difference Vpzt is larger than a sum of a voltage VC1 of the capacitor C1 and twice a forward drop voltage Vf of a diode constituting the full bridge rectifier 120, that is, VC1+2 Vf, the next-generated charges may be extracted as a DC current to be stored in the capacitor C1. In addition, while the displacement of the beam 104 is decreased, the piezoelectric element 108 generates a negative-direction current (that is, a current Ipzt having a minus value), and accordingly, the potential difference Vpzt between the first electrode 109a and the second electrode 109b is increased in the negative direction. If the negative-direction potential difference Vpzt is larger than a sum of VC1 and 2 Vf of the full bridge rectifier 120, the generated charges may be extracted as a DC current to be stored in the capacitor C1. In other words, even in the state where the switch SW of FIG. 1B is turned OFF, with respect to the portions hatched with slanting lines in FIG. 2(b), the charges may be stored in the capacitor C1.

Figure 2C:
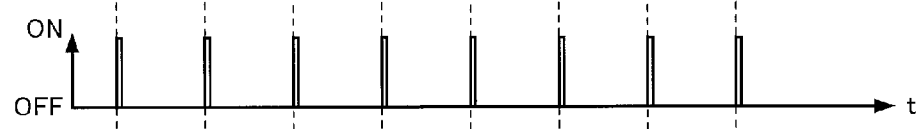
Figure 2D:
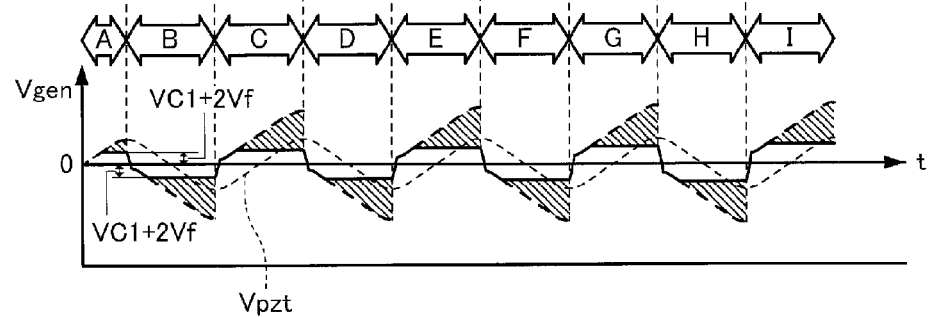

In the power generation unit 100 according to the embodiment, the control circuit 112 allows the switch SW to be turned ON at the timing illustrated in FIG. 2(c). And then, as illustrated in FIG. 2(d), such a phenomenon occurs that a voltage waveform between terminals of the piezoelectric element 108 seems to be shifted when the switch SW is turned ON. In other words, for example in a time interval B indicated by "B" in FIG. 2(d), a voltage waveform indicated by a thick broken line occurs, which appears to be obtained by shifting a voltage waveform Vpzt indicated by a thin broken line corresponding to the electromotive force of the piezoelectric element 108 in the minus direction, between the terminals of the piezoelectric element 108. The reason of occurrence of the phenomenon will be described later. In addition, in a time interval C indicated by "C" in FIG. 2(d), a voltage waveform indicated by a thick broken line occurs, which appears to be obtained by shifting the voltage waveform Vpzt corresponding to the electromotive force of the piezoelectric element 108 in the plus direction. Similarly, in the following time interval D, time interval E, time interval F, or the like, a voltage waveform indicated by a thick broken line occurs, which appears to be obtained by shifting the voltage waveform Vpzt corresponding to the electromotive force of the piezoelectric element 108 in the plus or minus direction. Therefore, with respect to the portions where the shifted voltage waveform exceeds the sum of VC1 and 2 Vf (the portions hatched with slanting lines in FIG. 2(d)), the charges generated by the piezoelectric element 108 may be stored in the capacitor C1. Furthermore, as a result of the charge flow from the piezoelectric element 108 to the capacitor C1, the voltage Vgen between the terminals of the piezoelectric element 108 (the voltage between the first electrode 109a and the second electrode 109b) is clipped at a voltage of the sum of VC1 and 2 Vf. As a result, the voltage waveform between the first electrode 109a and the second electrode 109b becomes the waveform indicated by a thick solid line in FIG. 2(d).

As clarified from comparison of the case where the switch SW illustrated in FIG. 2(b) remains OFF with the case where the switch SW is turned ON at a timing where a deformation direction of the beam 104 is switched as illustrated in FIG. 2(d), in the power generation unit 100 according to the embodiment, it is possible to efficiently store charges in the capacitor C1 by turning ON the switch SW at an appropriate timing.

In addition, if charges are stored in the capacitor C1, the voltage between the terminals of the capacitor C1 is increased. Accordingly, the shift amount of the voltage waveform is increased. For example, as seen from comparison of the time interval B (state where charges are not stored in the capacitor C1) in FIG. 2(d) and the time interval H (state where a small amount of charges is stored in the capacitor C1) in FIG. 2(d), the shift amount of the voltage waveform in the time interval H becomes large. Similarly, as seen from comparison of the time interval C and the time interval I in FIG. 2(d), the shift amount of the voltage waveform in the time interval I where the charges stored in the capacitor C1 is increased becomes large. Although the reason of the occurrence of this phenomenon is described later, as a result of the phenomenon, in the power generation unit 100 according to the embodiment, it is also possible to store a voltage equal to or higher than the potential difference Vpzt generated between the first electrode 109a and the second electrode 109b in the capacitor C1 by deformation of the piezoelectric element 108. As a result, a particular boosting circuit is unnecessary to provide, so that it is possible to obtain a small-sized, high-efficiency power generation unit.

C. Operating Principles of Power Generation Unit

FIGS. 3A-3F are explanation diagrams conceptually illustrating a first half of operating principles of the power generation unit 100 according to the embodiment. In addition, FIGS. 4A-4F are explanation diagrams conceptually illustrating a second half of the operating principles of the power generation unit 100 according to the embodiment. FIGS. 3A-3F conceptually illustrate flow of charges of C0 when the switch SW is turned ON according to the deformation of the piezoelectric element 108. FIG. 3(a) illustrates a state where the piezoelectric element 108 (accurately, the beam 104) is deformed upwards (the upper surface side thereof becomes concave). If the piezoelectric element 108 is deformed upwards, a positive-direction current is flowed from a current source, so that charges are stored in the C0 and a positive-direction voltage is generated between the terminals of the piezoelectric element 108. The voltage value is increased in proportion to an increase in an increase in deformation of the piezoelectric element 108. Therefore, at a timing when the deformation of the piezoelectric element 108 is at a peak (a timing when the amount of charges is at a peak; refer to FIG. 3(b)), the switch SW is turned ON.

FIG. 3(c) illustrates state just after the switch SW is turned ON. Since charges are stored in the C0, the charge is to be flowed to the inductor L. If a current is flowed in the inductor L, a magnetic flux is generated (magnetic flux is increased). The inductor L has a property (self-induction effect) of allowing a reverse electromotive force to be generated in the direction of preventing a change in the magnetic flux penetrating itself. When the switch SW is turned ON, the magnetic flux is to be increased due to the flowing of the charges, and thus, the reverse electromotive force is generated in the direction of preventing the increase in the magnetic flux (in other words, in the direction of preventing the flowing of the charges). In addition, the magnitude of the reverse electromotive force is proportional to the change rate of the magnetic flux (change amount per unit time). In FIG. 3(c), the reverse electromotive force generated in the inductor L in this manner is indicated by an arrow hatched with slanting lines. Since the reverse electromotive force is generated, although the switch SW is turned ON, only a few amount of the charges of the piezoelectric element 108 starts to be flowed. In other words, only a few amount of the current flowed in the inductor L is increased.

After that, if the current flowed in the inductor L is at a peak, the change rate of the magnetic flux is "zero", so that the reverse electromotive force becomes "zero" as illustrated in FIG. 3(d). And now, the current starts to be decreased. And then, since the magnetic flux penetrating the inductor L is decreased, an electromotive force is generated in the inductor L in a direction of preventing the magnetic flux from being decreased (a direction where the current is to be flowed) (refer to FIG. 3(e)). As a result, charges are extracted from the C0 by the electromotive force, and a current continues to be flowed in the inductor L. If loss does not occur during the transportation of the charges, all the charges generated according to the deformation of the piezoelectric element 108 are transported, and a state is formed where the positive and negative charges are accurately transposed (that is, a state where the positive charges are distributed at the lower surface side of the piezoelectric element 108 and the negative charges are distributed at the upper surface side thereof). FIG. 3(f) illustrates a state where all positive and negative charges generated by the deformation of the piezoelectric element 108 are transported.

If the switch SW is maintained ON as it is, the phenomenon contrary to the aforementioned phenomenon occurs. In other words, positive charges of the lower surface side of the piezoelectric element 108 is to be flowed to the inductor L, and at this time, a reverse electromotive force is generated in the inductor L in the direction of preventing the charges from being flowed. Next, after the current flowing in the inductor L reaches the peak, the current is changed to be decreased. At this time, an electromotive force is generated in the inductor L in the direction of preventing the current from being decreased (the direction of maintaining the current flow). As a result, in the state (the state illustrated in FIG. 3(b)), all the positive charges existing on the lower surface side of the piezoelectric element 108 are transported to the upper surface side. The positive charges which return to the upper surface side of the piezoelectric element 108 in this manner are transported again to the lower surface side as described above with reference to FIGS. 3(b) to 3(f).

In this manner, after the switch SW is turned ON in the state where charges are stored in the C0, if the state is maintained, a kind of a resonance phenomenon occurs where the direction of the current is alternately reversed between the piezoelectric element 108 and the inductor L. In addition, since the period of the resonance phenomenon is a resonance period T of a so-called LC resonance circuit, $T=2\pi(LC)^{0.5}$ is satisfied, where C is a magnitude (capacitance) of a capacitive component C0 included in the piezoelectric element 108 and L is a magnitude (inductance) of an inductive component of the inductor L. Therefore, the time from the time point when the switch SW is turned ON (the state illustrated in FIG. 3(b)) to the time point when the state illustrated FIG. 3(f) is formed is T/2.

Now, at the time point when T/2 elapses after the switch SW is turned ON, as illustrated in FIG. 4(a), the switch SW is turned OFF. Next, from this state, the piezoelectric element 108 (accurately, the beam 104) is deformed downwards (so that the lower surface side becomes concave). Although the piezoelectric element 108 is deformed upwards in FIG. 3(a) described above, since the piezoelectric element 108 is deformed downwards in FIG. 4(a), a negative-direction current is flowed from the current source, and charges are stored in the C0 so that the voltage between the terminals of the piezoelectric element 108 is increased in the negative direction. In addition, as described above with reference to FIGS. 3(a) to 3(f), in a stage before the piezoelectric element 108 (accurately, the beam 104) is deformed downwards, positive charges are distributed at the lower surface side of the piezoelectric element 108, and negative charges are distributed at the upper surface side thereof. Therefore, in addition to these charges, new positive charges are stored in the lower surface side, and new negative charges are stored in the upper surface side. FIG. 4(b) illustrates a state where new charges are stored in the piezoelectric element 108 by allowing the piezoelectric element 108 (accurately, the beam 104) to be deformed in the state where the switch SW is turned OFF.

Next, if the switch SW is turned ON in this state, the positive charges stored at the lower surface side of the piezoelectric element 108 are to be flowed to the inductor L. At this time, since a reverse electromotive force is generated in the inductor L (refer to FIG. 4(c)), a small amount of current starts to be flowed. However, in a short time, the current reaches its peak, and after that, the current is changed to be decreased. Therefore, an electromotive force is generated in the inductor L in the direction of preventing the current from being decreased (the direction of maintaining the current flow) (refer to FIG. 4(e)). Due to the electromotive force, the current is maintained to be flowed, and at last, all the positive charges distributed at the lower surface side of the piezoelectric element 108 are transported to the upper surface side, and all the negative charges distributed at the upper surface side are transported to the lower surface side (refer to FIG. 4(f)). In addition, the time taken for all the positive charges of the lower surface side to be transported to the upper surface side and for all the negative charges of the upper surface side to be transported to the lower surface side becomes the time T/2 corresponding to the half period of the LC resonance circuit. Next, if the time T/2 elapses after the switch SW is turned ON, the switch SW is turned OFF. At this time, if the piezoelectric element 108 (accurately, the beam 104) is deformed upwards (so that the upper surface side becomes concave), so that positive and negative charges can be further stored in the piezoelectric element 108.

As described hereinbefore, in the power generation unit 100 according to the embodiment, after charges are generated by deforming the piezoelectric element 108, the piezoelectric element 108 is connected to the inductor L to form a resonance circuit only for a period that is a half the resonance period, so that the distribution of the positive and negative charges in the piezoelectric element 108 is reversed. After that, new charges are generated by deforming the piezoelectric element 108 in the reverse direction. Since the distribution of the positive and negative charges in the piezoelectric element 108 is reversed, newly generated charges are stored in the piezoelectric element 108. After that, the piezoelectric element 108 is connected to the inductor L only for a half of the resonance period again, and after the distribution of the positive and negative charges in the piezoelectric element 108 is reversed, the piezoelectric element 108 is deformed in the reverse direction. When the piezoelectric element 108 is repetitively deformed by repeating the aforementioned operation, it is possible to increase the charges stored in the piezoelectric element 108.

As described above with reference to FIGS. 2A-2D, in the power generation unit 100 according to the embodiment, a peculiar phenomenon occurs where the voltage waveform between the terminals of the piezoelectric element 108 is shifted when the switch SW is turned ON. This phenomenon is generated by the following mechanism. In other words, for example, in the time interval A illustrated in FIG. 2(d), a voltage between the first electrode 109a and the second electrode 109b is generated according to the deformation of the piezoelectric element 108 (accurately, the beam 104). Since the first electrode 109a and the second electrode 109b are connected to the full bridge rectifier 120, the charges corresponding to the portion exceeding the voltage of the sum of VC1 and 2 Vf are flowed into the capacitor C1 connected to the full bridge rectifier 120. As a result, when the switch SW is turned ON at the time point when the deformation of the beam 104 is at a peak, the positive and negative charges remaining in the piezoelectric element 108 at this time are transported through the inductor L, so that the arrangement of the positive and negative charges in the piezoelectric element 108 is switched.

Next, if the beam 104 is deformed in the reverse direction in the state where the arrangement of the positive and negative charges is switched, the voltage waveform according to the piezoelectric effect occurs between the first and second electrodes 109a and 109b of the piezoelectric element 108. In other words, a change in voltage according to the deformation occurs in the piezoelectric element 108 in the state where the polarities of the first and second electrodes 109a and 109b of the piezoelectric element 108 are switched. As a result, in the time interval B illustrated in FIG. 2(d), a voltage waveform occurs, which appears to be obtained by shifting the voltage waveform occurring in the piezoelectric element 108 according to the deformation of the beam 104. Moreover, as described above, since the charges corresponding to the portion exceeding the voltage of the sum of VC1 and 2 Vf are flowed into the capacitor C1, the voltage between the first and second electrodes 109a and 109b of the piezoelectric element 108 is clipped at the voltage of the sum of VC1 and 2 Vf. After that, if the switch SW is turned ON only for a time of a half of the resonance period, the arrangement of the positive and negative charges remaining in the piezoelectric element 108 is switched. Next, the beam 104 is deformed in the state, so that the voltage waveform according to the piezoelectric effect occurs in the piezoelectric element 108. Therefore, in the time interval C illustrated in FIG. 2(d), a voltage waveform also occurs which appears to be obtained by shifting the voltage waveform according to the deformation of the beam 104.

In addition, as described above with reference to FIGS. 2A-2D, in the power generation unit 100 according to the embodiment, while the beam 104 is repetitively deformed, a phenomenon also occurs where the shift amount of the voltage waveform is gradually increased. Therefore, it is possible to obtain a great effect where a voltage higher than the potential difference occurring between the first electrode 109a and the second electrode 109b according to the piezoelectric effect of the piezoelectric element 108 can be stored in the capacitor C1. The phenomenon occurs according to the following mechanism.

First, as illustrated in the time interval A or B in FIG. 2(d), in the case where the C1 is not charged, if the voltage occurring between the terminals of the piezoelectric element 108 exceeds the 2 Vf of the full bridge rectifier 120, charges are flowed from the piezoelectric element 108 into the capacitor C1, the voltage occurring between the terminals of the piezoelectric element 108 is clipped at 2 Vf. However, according to the storages of the charges in the capacitor C1, the voltage between the terminals of the capacitor C1 is increased. Accordingly, after that, the voltage between the terminals of the capacitor C1 becomes a voltage higher than the sum of VC1 and 2 Vf, and charges start to be flowed from the piezoelectric element 108. Therefore, the clipped value of the voltage between the terminals of the piezoelectric element 108 is gradually increased according to the storage of the charges in the capacitor C1.

In addition, as described above with reference to FIGS. 3A-3F and 4A-4F, unless charges are not drained out from the piezoelectric element 108, when the piezoelectric element 108 (accurately, the beam 104) is deformed, the charges in the piezoelectric element 108 is increased, so that the voltage between the terminals of the piezoelectric element 108 is increased. Therefore, if loss of charges is not considered when the charges are flowed in the inductor L or the switch SW, it is possible to increase the voltage between the terminals of the piezoelectric element 108. Therefore, according to the power generation unit 100 according to the embodiment, without a particular boosting circuit provided, it is possible to generate power in the state where voltage boosting up to the voltage necessary for driving the electric load is naturally achieved.

D. Switch Changing-over Timing

As described hereinbefore, in the power generation unit 100 according to the embodiment, the piezoelectric element 108 is connected to the inductor L only for a time of a half of the resonance period at a timing when the piezoelectric element 108 (accurately, the beam 104) is repetitively deformed to allow the deformation direction to be switched. Accordingly, it is possible to most effectively store the charges in the capacitor C1, and since an additional boosting circuit is unnecessary, it is possible to obtain an excellent feature that it is possible to easily miniaturize the power generation unit. Even if the timing when the switch SW is turned ON by the control circuit 112 and the timing when the deformation direction of the beam 104 is switched are not coincident with each other, it is possible to boost the voltage Vgen between the terminals of the piezoelectric element 108 by allowing the switch SW to be turned ON at a predetermined period only for a time of half of the resonance period of the LC resonance circuit. However, if the timing when the switch SW is turned ON and the timing when the deformation direction of the beam 104 is switched are not coincident with each other, generating efficiency deteriorates. Hereinafter, the reason will be described.

Figure 5A:
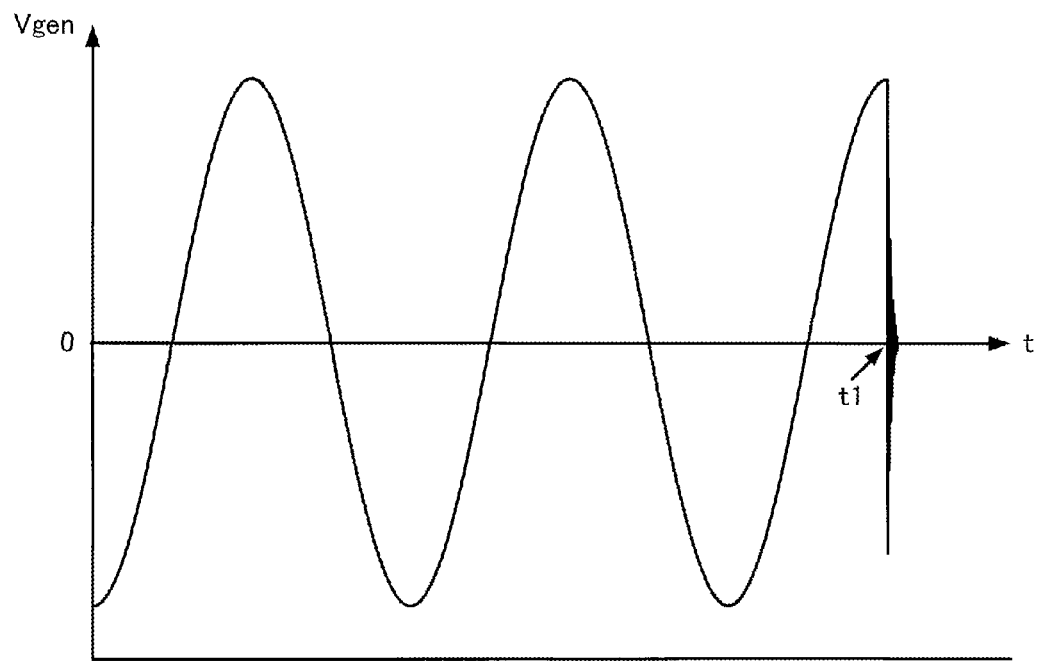
FIG. 5A is an explanation diagram illustrating a reason why generation efficiency deteriorates if a switch is not turned on at an appropriate timing.
Figure 5B:
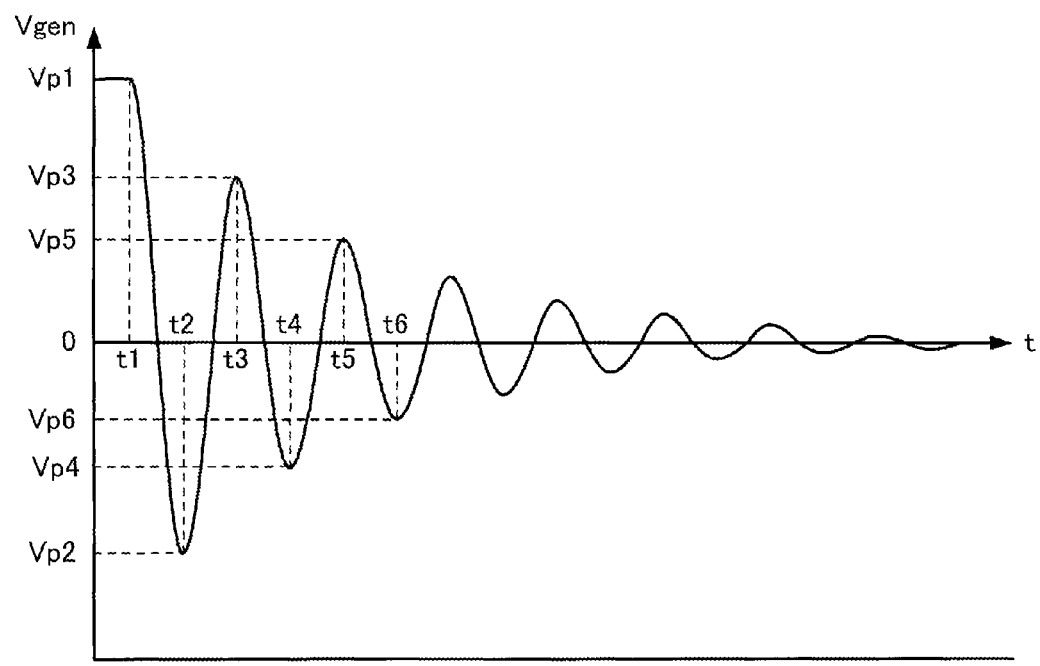
FIG. 5B is an explanation diagram illustrating a reason why generation efficiency deteriorates if a switch is not turned on at an appropriate timing.

FIG. 5A illustrates a situation of the voltage Vgen between the terminals of the piezoelectric element 108 in the case where it is supposed that the switch SW is not turned OFF after the switch SW is turned ON at a time point t1 when the deformation direction of the beam 104 is switched. FIG. 5B illustrates an enlarged view of the portion after the time point t1 of FIG. 5A. In addition, in the example of FIGS. 5A and 5B, neither the full bridge rectifier 120 nor the capacitor C1 is configured to be installed.

At the time point t1, the Vgen is at a peak, and the switch SW is turned ON, so that the positive and negative peak values Vp1, Vp2, Vp3, Vp4, Vp5, Vp6, . . . alternately occur and are attenuated at a period of 1/2 of the resonance period T of the LC resonance circuit (time point t1, t2, t3, t4, t5, t6, . . . ). If the switch SW is turned OFF at the time point t2 after only the time T/2 elapses from the time point t1, the aforementioned shift amount of the Vgen becomes the sum of the absolute value of the Vp1 and the absolute value of the Vp2 (|Vp1|+|Vp2|). In addition, as described with reference to FIGS. 3 and 4, since the Vp2 is the voltage value when the positive and negative charges of the capacitive component C0 are switched by the resonance of the LC resonance circuit, the absolute value of Vp2 is increased in proportion to an increase in the absolute value of the Vp1. Therefore, the shift amount of the Vgen is increased in proportion to an increase in the absolute value of the Vp1.

Figure 6:
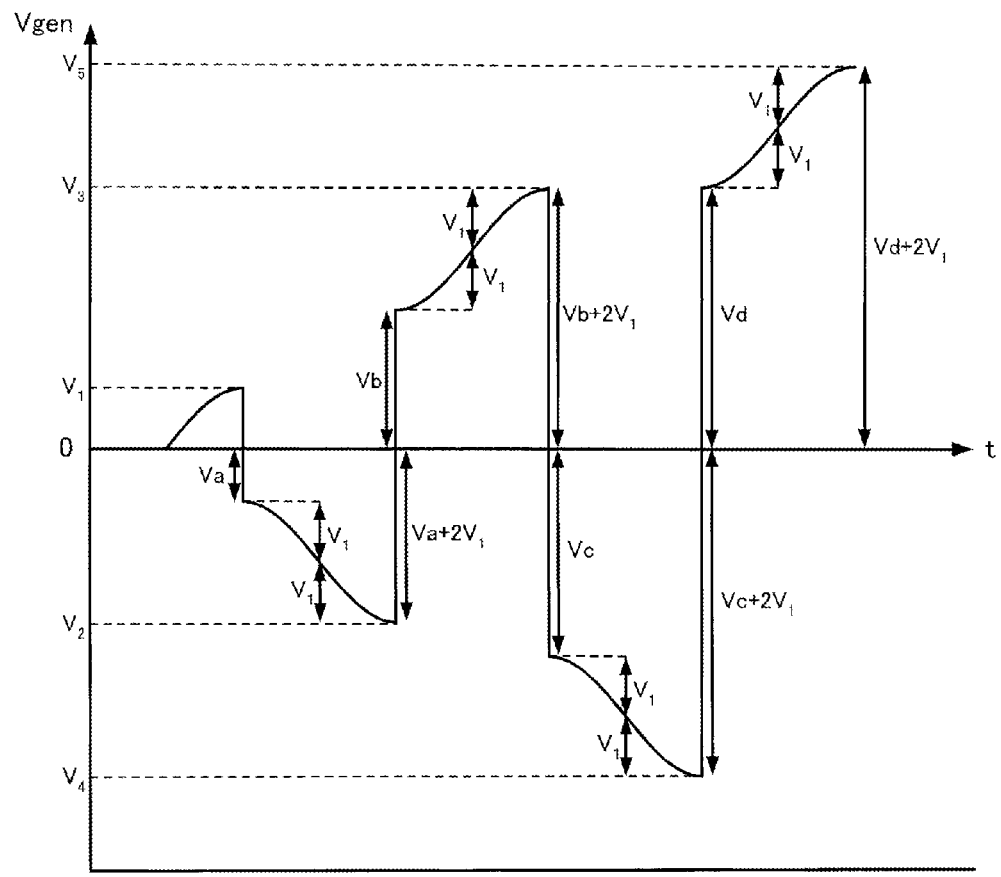
FIG. 6 is an explanation diagram illustrating a reason why generation efficiency deteriorates if a switch is not turned on at an appropriate timing.

FIG. 6 illustrates a situation of the voltage Vgen between the terminals of the piezoelectric element 108 in the case where the switch SW is turned ON only for a time T/2 each time the deformation direction of the beam 104 is switched. In addition, in the example of FIG. 6, neither the full bridge rectifier 120 nor the capacitor C1 is also configured to be installed. If the amplitude of the electromotive force Vpzt generated by the piezoelectric element 108 is set to be constant, as illustrated in FIG. 6, firstly, when the switch SW is turned ON only for a time T/2 at the timing when the Vgen becomes a voltage value $V_1$ which is a positive peak value, the Vgen is shifted by $V_1$+Va in the minus direction. Next, secondly, the Vgen when the switch SW is turned ON is a voltage value $V_2$=−(Va+2$V_1$), and if the switch SW is turned ON for a time T/2, the Vgen is shifted by Vb+Va+2$V_1$ in the plus direction. Similarly, thirdly, the Vgen when the switch SW is turned ON is a voltage value $V_3$=Vb+2$V_1$, and if the switch SW is turned ON for a time T/2, the Vgen is shifted by Vc+Vb+2$V_1$ in the minus direction. Similarly, fourthly, the Vgen when the switch SW is turned ON is a voltage value $V_4$=−(Vc+2$V_1$), and if the switch SW is turned ON for a time T/2, the Vgen is shifted by Vd+Vc+2$V_1$ in the plus direction. Similarly, fifthly, the Vgen when the switch SW is turned ON is a voltage value $V_5$=−(Vd+2$V_1$). Herein, since $V_2$=−(Va+2$V_1$), it is obvious that |$V_2$|>|$V_1$|. In addition, $V_1$ and $V_2$ are the voltage values corresponding to Vp1 in FIG. 5B; Va and Vb are the voltage values corresponding to Vp2 of FIG. 5B; and since |$V_2$|>|$V_1$|, it is always satisfied that Vb>Va. In addition, $V_2$=−(Va+2$V_1$) and $V_3$=Vb+2$V_1$; since Vb>Va, it is always satisfied that |$V_3$|>|$V_2$|. Similarly, since |$V_3$|>|$V_2$|, it is always satisfied that Vc>Vb; and $V_3$=Vb+2$V_1$ and $V_4$=−(Vc+2$V_1$), and since Vc>Vb, it is always satisfied that |$V_4$|>|$V_3$|. Similarly, since |$V_4$|>|$V_3$|, it is always satisfied that Vd>Vc; and $V_4$=−(Vc+2$V_1$) and $V_5$=Vd+2$V_1$, and since Vd>Vc, it is always satisfied that |$V_5$|>|$V_4$|. In short, by allowing the switch SW to be turned ON only for a time T/2 at the timing when the deformation direction of the beam 104 is switched, the absolute value of the voltage Vgen between the terminals of the piezoelectric element 108 is boosted in the sequence of |$V_1$|<|$V_2$|<|$V_3$|<|$V_4$|<|$V_5$|< . . . .

Figure 7A:
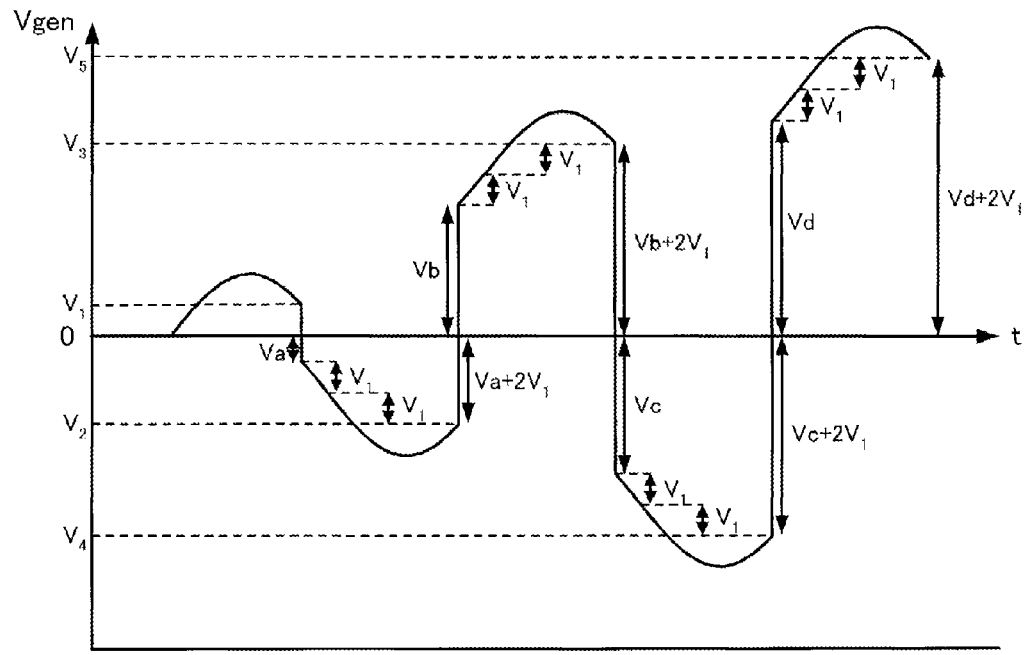
FIG. 7A is an explanation diagram illustrating a reason why generation efficiency deteriorates if a switch is not turned on at an appropriate timing.
Figure 7B:
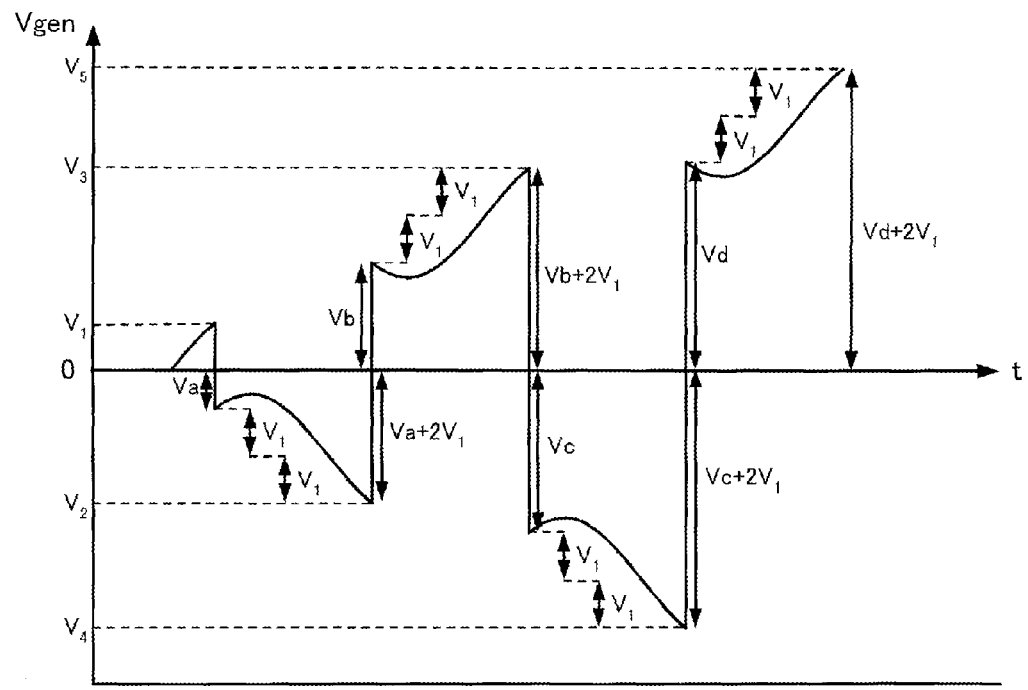
FIG. 7B is an explanation diagram illustrating a reason why generation efficiency deteriorates if a switch is not turned on at an appropriate timing.

The same consideration may be made even in the case where the timing when the deformation direction of the beam 104 is switched and the timing when the switch SW is turned ON are not coincident with each other. FIG. 7A illustrates a situation of the Vgen in the case where the switch SW is turned ON only for a time T/2 after the timing when the deformation direction of the beam 104 is switched. FIG. 7B illustrates a situation of the Vgen in the case where the switch SW is turned ON only for a time T/2 before the timing when the deformation direction of the beam 104 is switched. In addition, in the example of FIGS. 7A and 7B, neither the full bridge rectifier 120 nor the capacitor C1 is also configured to be installed.

In the example of FIGS. 7A and 7B, similarly to the example of FIG. 6, firstly, the Vgen when the switch SW is turned ON is a voltage value $V_1$; secondly, the Vgen when the switch SW is turned ON is a voltage value $V_2$=−(Va+2$V_1$); thirdly, the Vgen when the switch SW is turned ON is a voltage value $V_3$=Vb+2$V_1$; fourthly, the Vgen when the switch SW is turned ON is a voltage value $V_4$=−(Vc+2$V_1$); fifthly, the Vgen when the switch SW is turned ON is a voltage value $V_5$=−(Vd+2$V_1$); . . . . Herein, since $V_2$, $V_3$, $V_4$, $V_5$, . . . are expressed by the same equations as those of $V_2$, $V_3$, $V_4$, $V_5$, . . . of the case of FIG. 6, it is also satisfied that $V_2$>$V_1$, $V_3$>$V_2$, $V_4$>$V_3$, $V_5$>$V_4$, . . . . Therefore, although the switch SW is turned ON for a time T/2 at a non-coincident timing before or after the timing when the deformation direction of the beam 104 is switched, the Vgen is boosted in the sequence of |$V_1$|<|$V_2$|<|$V_3$|<|$V_4$|<|$V_5$|< . . . . However, since the voltages Va, Vb, Vc, Vd, . . . are increased in proportion to an increase in the voltage value $V_1$, in the example of FIG. 6, the boosting rate of the Vgen is high and the generating efficiency is high in comparison with the example of FIGS. 7A and 7B.

In addition, in the case where the switch SW is turned ON only for a time T/2 at the timing when the displacement of the beam 104 is zero (the Vgen is zero) (in the case where $V_1$=0 in FIGS. 7A and 7B), the resonance of the LC resonance circuit does not occur, and the Vgen is not boosted.

Figure 8:
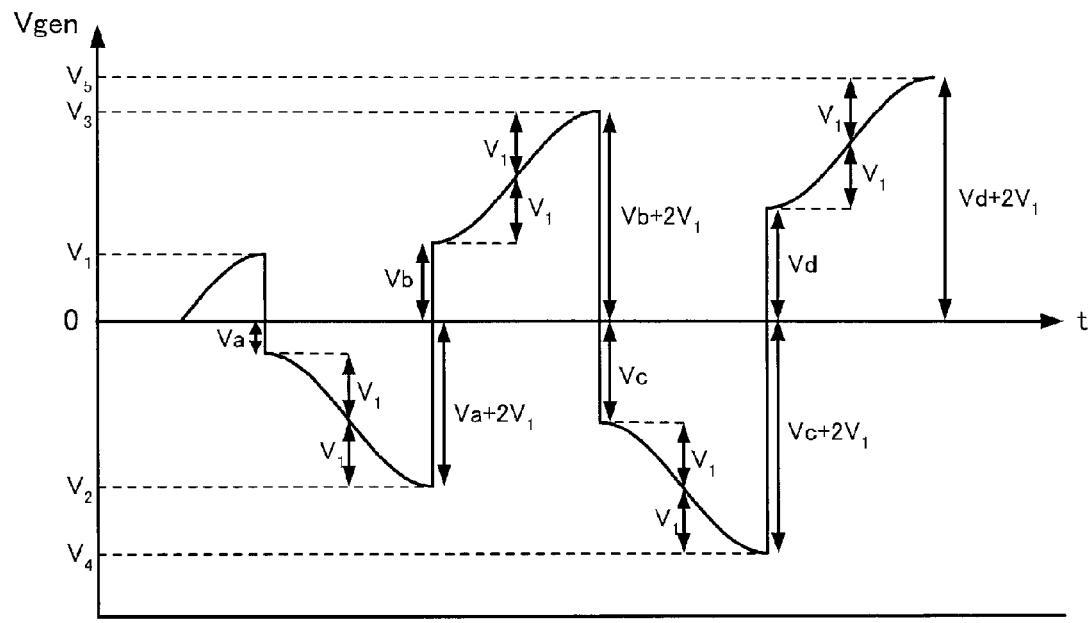
FIG. 8 is a diagram illustrating a waveform of a voltage between terminals of a piezoelectric element when a switch is turned on only for 3/2 of a resonance period of an LC resonance circuit.

As described hereinbefore, it is possible to maximize the generating efficiency by allowing the switch SW to be turned ON only for a time of a half of the resonance period of the LC resonance circuit at the time which is coincident with the timing when the deformation direction of the beam 104 is switched. In addition, although the generating efficiency deteriorates, it is possible to boost the Vgen by allowing the switch SW to be turned ON only for a predetermined time interval. For example, FIG. 8 illustrate an example of the voltage Vgen between the terminals of the piezoelectric element 108 in the case where the switch SW is turned ON only for a time of ¾ of the resonance period T at the timing when the deformation direction of the beam 104 is switched. In short, this case corresponds to the case where the switch SW is turned ON at the time point t1 and the switch SW is turned OFF at the time point t3 illustrated in FIG. 5B. In addition, in the example of FIG. 8, neither the full bridge rectifier 120 nor the capacitor C1 is also configured to be installed.

In the example of FIG. 8, similarly to the example of FIG. 6, firstly, the Vgen when the switch SW is turned ON is a voltage value $V_1$; secondly, the Vgen when the switch SW is turned ON is a voltage value $V_2=-(Va+2V_1)$; thirdly, the Vgen when the switch SW is turned ON is a voltage value $V_3=Vb+2V_1$; fourthly, the Vgen when the switch SW is turned ON is a voltage value $V_4=-(Vc+2V_1)$; fifthly, the Vgen when the switch SW is turned ON is a voltage value $V_5=-(Vd+2V_1)$; . . . . In addition, the Vgen is boosted in the sequence of $|V_1|<|V_2|<|V_3|<|V_4|<|V_5|<$. . . . However, since the Va, Vb, Vc, Vd, . . . are increased in proportion to an increase in the voltage value $V_1$, in the example of FIG. 6, the boosting rate of the Vgen is high and the generating efficiency is high in comparison with the example of FIG. 8.

Figure 9:
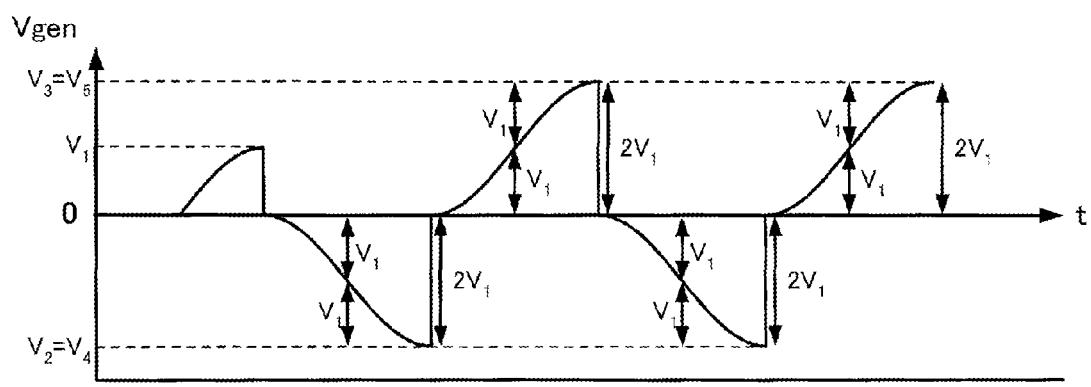
FIG. 9 is a diagram illustrating a waveform of a voltage between terminals of a piezoelectric element when a switch is turned on only for 1/4 of a resonance period of an LC resonance circuit.

On the other hand, FIG. 9 illustrates a situation of the voltage Vgen between the terminals of the piezoelectric element 108 in the case where the switch SW is turned ON only for a time of ¼ of the resonance period T at the timing when the deformation direction of the beam 104 is switched. In short, this case corresponds to the case where the switch SW is turned ON at the time point t1 and the switch SW is turned OFF at the time point (t1+t2)/2 illustrated in FIG. 5B. In addition, in the example of FIG. 9, neither the full bridge rectifier 120 nor the capacitor C1 is not configured to be installed.

In the example of FIG. 9, firstly, the Vgen when the switch SW is turned ON is a voltage value $V_1$; secondly, the Vgen when the switch SW is turned ON is a voltage value $V_2=-2V_1$; thirdly, the Vgen when the switch SW is turned ON is a voltage value $V_3=2V_1$; fourthly, the Vgen when the switch SW is turned ON is a voltage value $V_4=-2V_1$; and fifthly, the Vgen when the switch SW is turned ON is a voltage value $V_5=2V_1$; . . . . In other words, although the Vgen can be boosted up to $2V_1$, the Vgen cannot be boosted beyond the voltage.

Similarly, even in the case where the switch SW is turned ON only for a time of any one of ¾, ⁵⁄₄, ⁷⁄₄, ⁹⁄₄, . . . of the resonance period T at the timing when the deformation direction of the beam 104 is switched, it is satisfied that $V_2=-2V_1$, $V_3=2V_1$, $V_4=-2V_1$, $V_5=2V_1$, . . . , and although the Vgen can be boosted up to $2V_1$, the Vgen cannot be boosted beyond the voltage.

In this manner, if the switch SW is turned OFF at least when the Vgen has the polarity opposite to the polarity of the time when the switch SW is turned ON by the resonance of the LC resonance circuit, the Vgen is boosted. In short, with respect to the resonance period T of the LC resonance circuit, at least if the predetermined time interval when the switch SW is turned ON is set to a time which is be longer than $(n+¼)T$ and shorter than $(n+¾)T$ (n is an arbitrary integer of 0 or more), it is possible to efficiently boost the Vgen.

As described above, in the case where the switch SW is turned ON only for a time of ½ of the resonance period T, since the shift amount is increased to the maximum at the time when the switch SW is switched, the generating efficiency is at maximum. Therefore, in the power generation unit 100 according to the embodiment, the control circuit 112 allows the switch SW to be turned ON at the timing when the deformation direction of the beam 104 is switched, and if the time of ½ of the resonance period T elapses, the control circuit 112 allows the switch SW to be turned OFF.

Moreover, it is not easy to allow the switch SW to be turned ON at the timing when the deformation direction of the beam 104 is switched. For example, if it is considered that the magnitude of the displacement of the beam 104 is at maximum at the timing when the deformation direction of the beam 104 is switched, it may be configured so that the switch SW is turned ON by using a mechanical contact point at the timing when the displacement of the beam 104 is at maximum. However, if the adjustment of the contact point is deviated, the efficiency greatly deteriorates. Therefore, in the power generation unit 100 according to the embodiment, the voltage detection circuit 130 is provided, and the switch SW is controlled by comparing the potentials of the two terminals of the rectifier diode constituting the full bridge rectifier 120. Particularly, in the embodiment, the voltage detection circuit 130 compares the potentials of the two terminals (potentials of the anode and cathode) of the diode D1 and compares the potentials of the two terminals (potentials of the anode and cathode) of the diode D3. Therefore, by comparing the potentials of the anode and cathode of any one of the diodes D1 and D3 irrespective of the polarity of the current generated by the piezoelectric element 108, it is possible to allow the switch SW to be easily turned ON when the deformation direction of the beam 104 is switched.

FIGS. 10A-10E are explanation diagrams illustrating a reason that a timing when a deformation direction of a beam 104 is switched can be determined by comparing the potentials of the two terminals of the diode D1 and by comparing the potentials of the two terminals of the diode D3. FIGS. 10A-10E illustrate waveforms in the state where it is supposed that the switch SW is always turned OFF.

Figure 10A:
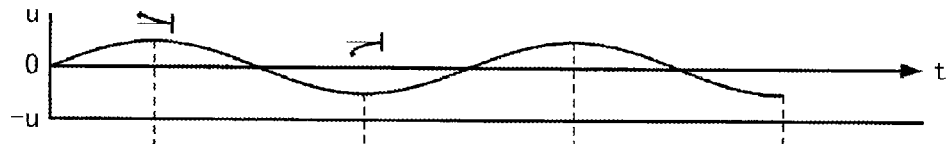
FIGS. 10A-10E are explanation diagrams illustrating a reason that a timing when a deformation direction of a beam is switched can be determined by comparing potentials of two terminals of a diode.
Figure 10B:
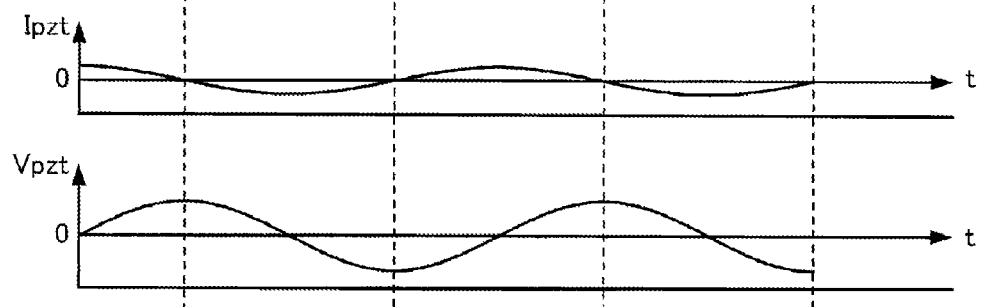
Figure 10C:
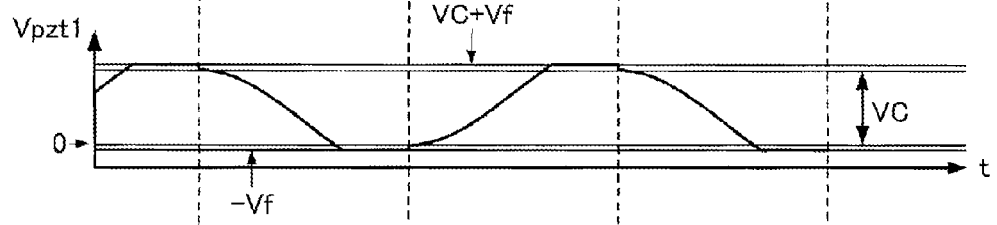
Figure 10D:
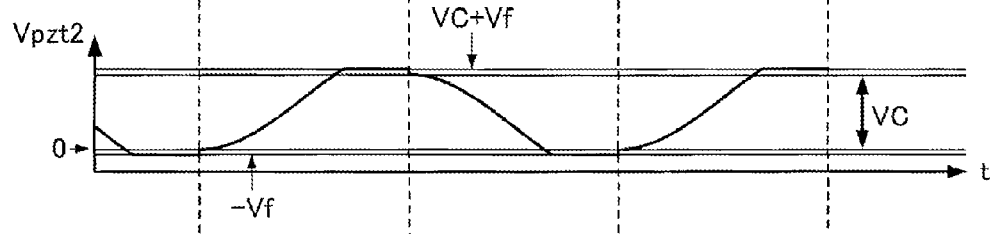

FIG. 10(a) illustrates a displacement of the beam 104. In addition, FIG. 10(b) illustrates a situation where the current Ipzt and the electromotive force Vpzt generated by the piezoelectric element 108 are changed according to vibration of the beam 104. In addition, FIGS. 10(c) and 10(d) illustrate a situation where the potential Vpzt1 of the first electrode 109a of the piezoelectric element 108 is changed and a situation where the potential Vpzt2 of the second electrode 109b is changed, respectively. In addition, in FIGS. 10(c) and 10(d), the potential of the minus terminal of the capacitor C1 is set to zero.

As illustrated, if the displacement of the beam 104 is increased in the positive direction, the electromotive force Vpzt is also increased in the positive direction, so that the potential Vpzt1 of the first electrode 109a is increased. Next, if the Vpzt1 (=anode potential of the diode D1) is higher than the potential VC of the plus terminal of the capacitor C1 (=cathode potential of the diode D1), the positive-direction current Ipzt generated by the piezoelectric element 108 is flowed to the diode D1 constituting the full bridge rectifier 120. Accordingly, the potential Vpzt1 of the first electrode 109a is clamped at the potential of the sum of the potential VC of the plus terminal of the capacitor C1 and the forward drop voltage Vf of the diode D1.

Similarly, if the displacement of the beam 104 is increased in the negative direction, the electromotive force Vpzt is also increased in the negative direction, so that the potential Vpzt2 of the second electrode 109b is increased. Next, if the Vpzt2 (=anode potential of the diode D3) is higher than the potential VC of the plus terminal of the capacitor C1 (=cathode potential of the diode D3), the negative-direction current Ipzt generated by the piezoelectric element 108 is flowed to the diode D3 constituting the full bridge rectifier 120. Accordingly, the potential Vpzt2 of the second electrode 109b is clamped at the potential of the sum of the potential VC of the plus terminal of the capacitor C1 and the forward drop voltage Vf of the diode D3.

In addition, at the timing when the magnitude of the displacement of the beam 104 is at a peak (that is, the timing when the deformation direction of the beam 104 is switched), the direction of the current Ipzt generated by the piezoelectric element 108 is reversed. For example, if the magnitude of the displacement of the beam 104 is at a peak in the state where the positive electromotive force is generated by the piezoelectric element 108, the current Ipzt which has been flowed in the positive direction is reversed to the negative direction. Therefore, no current is flowed in the diode D1 where a current has been flowed, so that the potential Vpzt1 of the first electrode 109a becomes lower than the VC. Similarly, if the magnitude of the displacement of the beam 104 is at a peak in the state where the negative electromotive force is generated by the piezoelectric element 108, the current Ipzt which has been flowed in the negative direction is reversed to the positive direction. Therefore, no current is flowed in the diode D3 where a current has been flowed, so that the potential Vpzt2 of the second electrode 109b becomes lower than the VC.

Therefore, the timing when the deformation direction of the beam 104 is switched from positive to negative (the timing when the displacement of the beam 104 is at a positive peak) is coincident with the timing when the current which has been flowed in the diode D1 is not flowed and the Vpzt1 is changed from a potential higher than the VC to a potential lower than the VC. Similarly, the timing when the deformation direction of the beam 104 is changed from negative to positive (the timing when the displacement of the beam 104 is at a negative peak) is coincident with the timing when the current which has been flowed in the diode D3 is not flowed and the Vpzt2 is changed from a potential higher than the VC to a potential lower than the VC. Therefore, as illustrated in FIG. 1B, if it is detected by using the voltage detection circuit 130 whether the potential of the anode of the diode D1 becomes lower than (or equal to) the potential of the cathode after the potential of the anode of the diode D1 becomes higher than the potential of the cathode or whether the potential of the anode of the diode D3 becomes lower than (or equal to) the potential of the cathode after the potential of the anode of the diode D3 becomes higher than the potential of the cathode, the switch SW is preferably turned ON at this timing only for a predetermined time interval (for example, the time of ½ of the resonance period T of the LC resonance circuit) indicated by a broken line in FIG. 10(e).

Figure 10E:
Figure 11A:
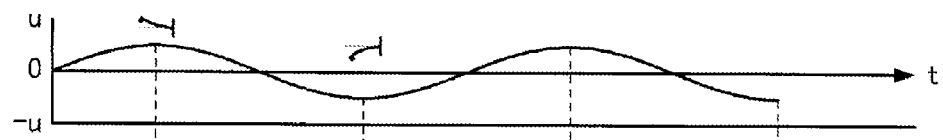
FIGS. 11A-11E are explanation diagrams illustrating a reason that a timing when a deformation direction of a beam is switched can be determined by comparing potentials of two terminals of a diode.
Figure 11B:
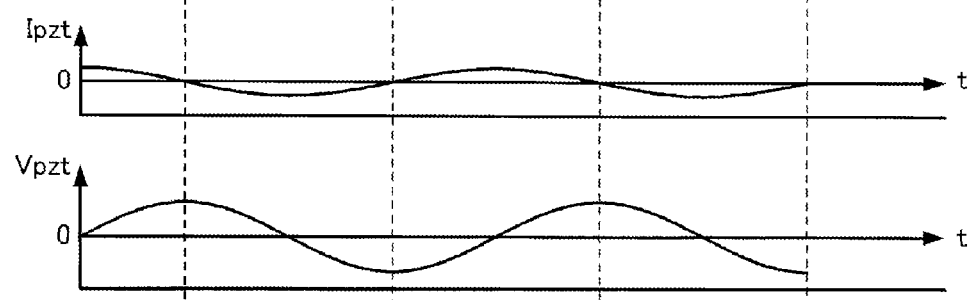
Figure 11C:
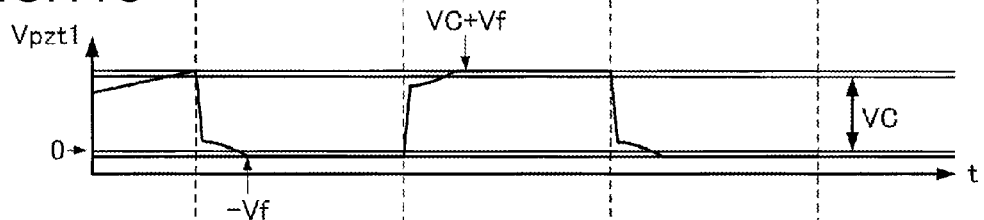
Figure 11D:
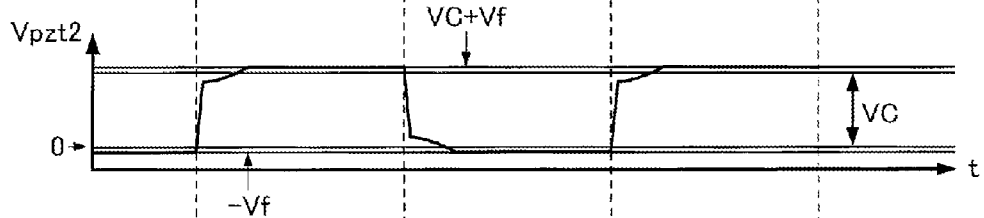
Figure 11E:
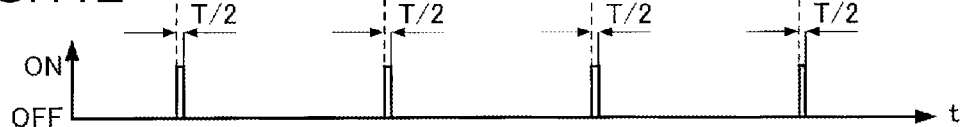

In addition, although FIGS. 10A-10E illustrate the waveforms in the state where it is supposed that the switch SW is turned OFF, FIGS. 11A-11E illustrate the waveforms in the case where the switch SW is actually turned ON at the timing indicated by a broken line of FIG. 10(e). The displacement of the beam 104 illustrated in FIG. 11(a) is the same as that of FIG. 10(a). In addition, the change in the current Ipzt and the electromotive force Vpzt illustrated in FIG. 11(b) is the same as that of FIG. 10(b). As illustrated in FIGS. 11(c) and 11(d), the Vpzt1 and the Vpzt2 are shifted at the timing when the switch SW is turned ON as illustrated in FIG. 11(e).

FIG. 12 is a block diagram illustrating an example of a configuration of the voltage detection circuit 130. In addition, FIGS. 13A-13E illustrate an example of output waveforms of components of the voltage detection circuit 130.

A comparator 132 compares the potential Vpzt1 of the first electrode 109a of the piezoelectric element 108 (the potential of the anode of the diode D1) and the potential VC of the plus terminal of the capacitor C1 (the cathode potential of the diode D1) to output a binarized (pulsed) signal (Vpls1).

A comparator 134 compares the potential Vpzt2 of the second electrode 109b of the piezoelectric element 108 (the potential of the anode of the diode D3) and the potential VC of the plus terminal of the capacitor C1 (the cathode potential of the diode D3) to output a binarized (pulsed) signal (Vpls2).

An OR circuit 136 outputs a logic OR signal (Vpls) of the output signal (Vpls1) of the comparator 132 and the output signal (Vpls2) of the comparator 134. The switch SW is preferably turned ON at the timing of a falling edge of the output signal (Vpls) of the OR circuit 136.

Figure 14:
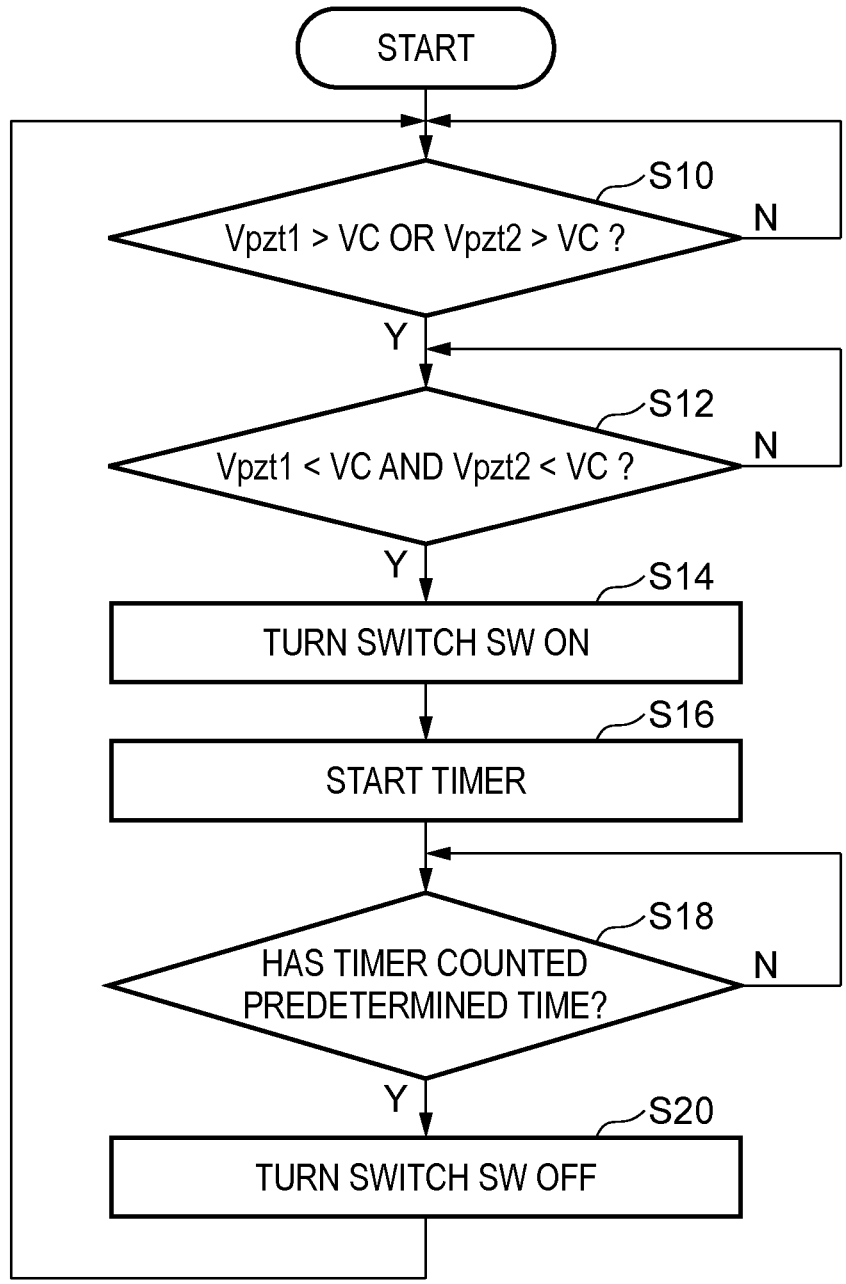
FIG. 14 is a flowchart illustrating a switch control process.

FIG. 14 is a flowchart illustrating a switch control process of switching the turning ON/OFF of the switch SW. This process is executed, for example, by a CPU (Central Processing Unit) embedded in the control circuit 112.

If the switch control process starts, the CPU of the control circuit 112 stands by until it is detected whether the potential Vpzt1 of the first electrode 109a of the piezoelectric element 108 (the potential of the anode of the diode D1) is higher than the potential VC of the plus terminal of the capacitor C1 (the cathode potential of the diode D1) or whether the potential Vpzt2 of the second electrode 109b of the piezoelectric element 108 (the potential of the anode of the diode D3) is higher than the potential VC of the plus terminal of the capacitor C1 (the cathode voltage of the diode D3) (N in Step S10). For example, the CPU of the control circuit 112 monitors the output signal (Ipls) of the voltage detection circuit 130 and stands by until a rising edge is detected.

If the state where the Vpzt1 is higher than the VC or the Vpzt2 is higher than the VC is detected (Y in Step S10), the CPU of the control circuit 112 stands by until the state where the Vpzt1 is lower than the VC and the Vpzt2 is lower than the VC is detected (N in Step S12). For example, the CPU of the control circuit 112 monitors the output signal (Ipls) of the voltage detection circuit 130 and stands by until a falling edge is detected.

Next, if the state where the Vpzt1 is lower than VC and the Vpzt2 is lower than the VC is detected (Y in Step S12), the CPU of the control circuit 112 allows the switch SW to be turned ON (Step S14), and after that, a timer (not shown) embedded in the control circuit 112 starts (Step S16). The timer counts a preset time, in the embodiment, the time of ½ of the resonance period of the LC resonance circuit. In addition, the preset time may be stored in a memory (not shown) so as to be rewritable. In addition, if a preset time need not be rewritable, the preset time may not be stored in a memory.

Next, the CPU of the control circuit 112 stands by until the timer counts the preset time (until the time of ½ of the resonance period of the LC resonance circuit elapses) (N in Step S18). If the timer counts the preset time (Y in Step S18), the switch SW is turned OFF (Step S20).

The CPU of the control circuit 112 stands by again until the state where the Vpzt1 is higher than VC or the Vpzt2 is higher than the VC (N in Step S10), and a series of the aforementioned steps are repetitively performed.

In this manner, if the turning ON/OFF of the switch SW is performed, at least since the voltage between the terminals of the piezoelectric element 108 can be boosted, although the voltage of the capacitor C1 is increased, it is possible to store the charges.

In addition, in the embodiment, the control circuit 112 corresponds to the "controller" according to the invention.

As described hereinbefore, according to the power generation unit 100 according to the embodiment, by monitoring the potentials of the anode and cathode of the diode D1 and the potentials of the anode and cathode of the diode D3, it is possible to perform the turning ON/OFF of the switch SW at an appropriate timing every half of the period of the vibration (deformation) of the piezoelectric element 108. Accordingly, the voltage between the terminals of the piezoelectric element 108 is efficiently boosted, so that it is possible to improve the generating efficiency.

Particularly, it is possible to obtain higher generating efficiency by allowing the switch SW to be turned ON at a high accuracy at a timing which is coincident with the timing when the deformation direction of the piezoelectric element 108 is switched and the potential of the anode of the diode D1 (and the diode D3) is lower than the potential of the cathode. In addition, it is possible to obtain the highest generating efficiency by setting the time interval when the switch SW is turned ON to the time of ½ of the resonance period of the LC resonance circuit.

However, in the case where the displacement of the beam 104 is small or in the case where sufficient charges appear to be stored in the capacitor C1, there is some possibility that one of the potential Vpzt1 and Vpzt2 of the first and second electrodes 109a and 109b installed in the piezoelectric element 108 does not exceed the potential VC of the plus terminal of the capacitor C1. In this state, no current is flowed in the full bridge rectifier 120, and no charges are stored in the capacitor C1. On the other hand, when no current is flowed in the full bridge rectifier 120, since the state where the potential of the anode of the diode D1 is lower than the potential of the cathode and the potential of the anode of the diode D3 is lower than the potential of the cathode is maintained, the switch SW is maintained OFF. Therefore, according to the power generation unit 100 according to the embodiment, it is also possible to obtain an advantage in that, when charges cannot be stored in the capacitor C1, operations can be completed without wasteful power consumption to turn ON/OFF the switch SW.

E. Modified Examples

E-1. First Modified Example

Figure 15:
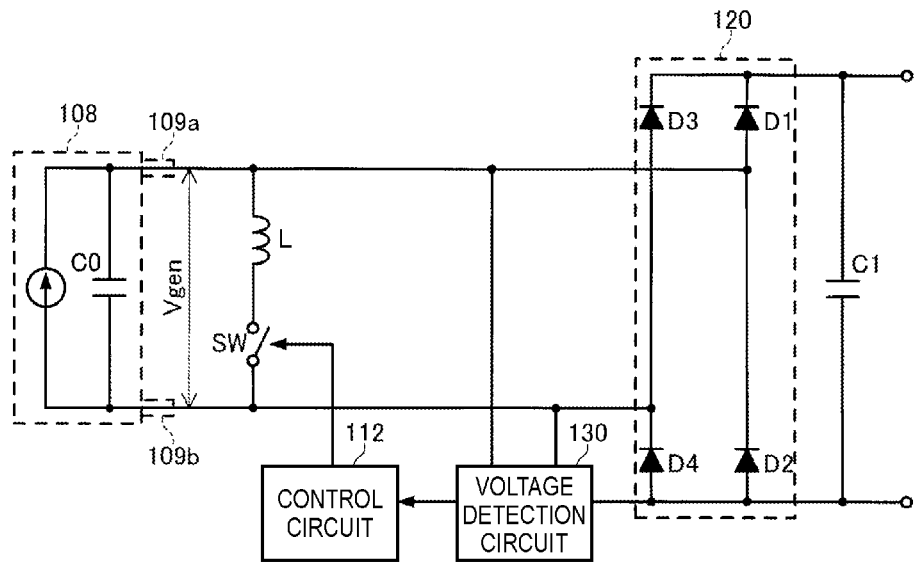
FIG. 15 is a diagram illustrating an example of a circuit configuration of a power generation unit according to a first modified example.

Although the potentials of the anode and cathode of the diode D1 and the potentials of the anode and cathode of the diode D3 are compared respectively in the embodiment described above, the potentials of the anode and cathode of the diode D2 and the potentials of the anode and cathode of the diode D4 may be compared respectively, for example, as illustrated in FIG. 15.

E-2. Second Modified Example

In addition, in the embodiment described above, if the potential of the anode of the diode D1 is at least slightly higher than the potential of the cathode or if the potential of the anode of the diode D3 is at least slightly higher than the potential of the cathode, the switch SW is turned ON/OFF. The turning ON/OFF of the switch SW also requires power, so that a portion of the power stored in the capacitor C1 is used. However, in the case where the switch SW is turned ON/OFF and maintained in the state according to environmental vibration, if the environmental vibration is relatively small, in some cases, power per unit time consumed due to the turning ON/OFF of the switch SW may be larger than the power stored in the capacitor C1. In other words, although the generating efficiency is increased by repeating the turning ON/OFF of the switch SW, it may be considered that power is not stored but decreased. Therefore, although the power is consumed due to the turning ON/OFF of the switch SW, it may configured so that the turning ON/OFF of the switch SW is performed only in the case where the power generation can be obtained so that the stored power is securely increased. More specifically, since the forward drop voltages Vf of the diodes D1 to D4 are changed according to the flowing current value, after the difference between the potentials of the anode and cathode of the diode D1 or the difference between the potentials of the anode and cathode of the diode D3 exceeds a predetermined threshold value, the voltage detection circuit 130 preferably allows the switch SW to be turned ON at the timing when the difference of the potentials is lower than the threshold value. It is preferable that, by simulation or sample evaluation, power consumption of the time when the switch SW is turned ON/OFF is considered, and the threshold value is determined so that the power stored in the capacitor C1 is increased.

E-3. Third Modified Example

Figure 16:
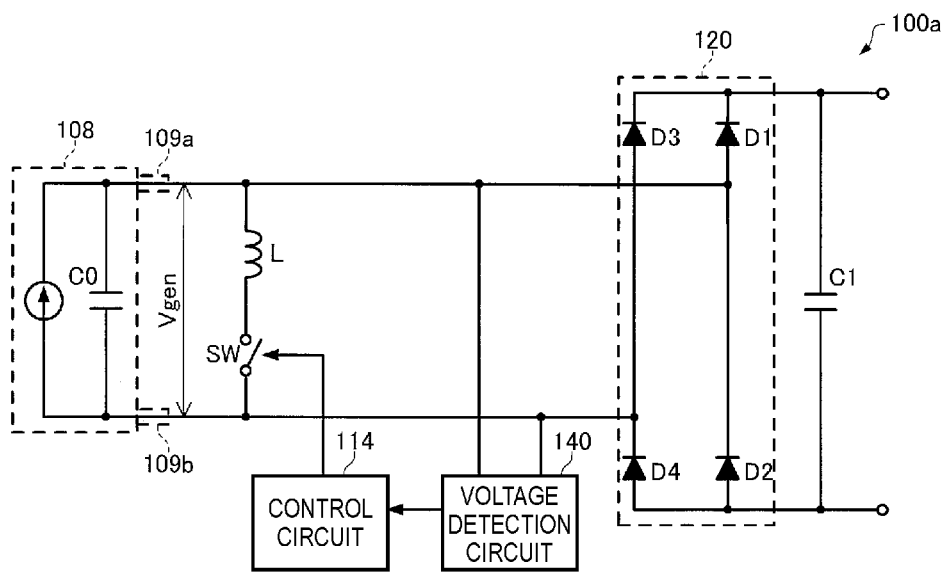
FIG. 16 is a diagram illustrating an example of a circuit configuration of a power generation unit according to a third modified example.

FIG. 16 is a diagram illustrating an example of a circuit configuration of a power generation unit 100a according to a third modified example. The same components as those of the power generation unit 100 illustrated in FIGS. 1A and 1B are denoted by the same reference numerals, and the detailed description thereof is omitted.

The power generation unit 100a according to a third modified example may include a piezoelectric member 108 which is formed by using a piezoelectric element, a pair of electrodes (first electrode 109a and second electrode 109b) which are installed in the piezoelectric member 108, a deformation member (beam 104) which repeatedly deforms the piezoelectric member 108, an inductor L which is installed between the pair of the electrodes (first and second electrodes 109a and 109b) and which together with a capacitive component C0 of the piezoelectric element 108 constitutes a resonance circuit, a switch SW which is connected in series to the inductor L, a rectifier (full bridge rectifier 120) which is installed between the pair of the electrodes (first and second electrodes 109a and 109b) to rectify an AC current generated by the piezoelectric element 108; a capacitor C1 which stores an output current of the rectifier (full bridge rectifier 120), a voltage detection unit (voltage detection circuit 140) which detects a voltage Vgen (voltage between the first electrode 109a and the second electrode 109b) of the piezoelectric member 108, and a controller (control circuit 114) which determines whether a first voltage detected by the voltage detection circuit 140 is a maximum value or a minimum value, wherein in the case where it is determined that the first voltage is a maximum value, when a second voltage detected by the voltage detection circuit 140 after detection of the first voltage is decreased from the maximum value to a value which is equal to or higher than a reference voltage, the controller allows the switch SW to be connected and, wherein in the case where it is determined that the first voltage is a minimum value, when the second voltage detected by the voltage detection circuit 140 after detection of the first voltage is increased from the minimum value to a value which is equal to or higher than the reference voltage, the controller allows the switch SW to be connected.

The control circuit 114 may be configured to include, for example, a CPU. The voltage detection circuit 140 may be configured to include, for example, an A/D converter to output voltage data obtained by digitizing the voltage Vgen of the piezoelectric element 108 to the control circuit 114.

FIGS. 17A-17E are explanation diagrams illustrating a reason that the timing when the deformation direction of the beam 104 is switched can be determined by detecting the voltage of the piezoelectric element 108. FIG. 17 describes a case where it can be regarded that a forward drop voltage Vf of a diode constituting the full bridge rectifier 120 is always constant.

Figure 17A:
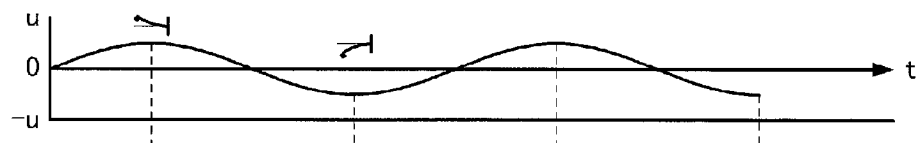
FIGS. 17A-17E are explanation diagrams illustrating a reason that a timing when a deformation direction of a beam is switched can be determined by detecting a voltage of a piezoelectric element.
Figure 17B:
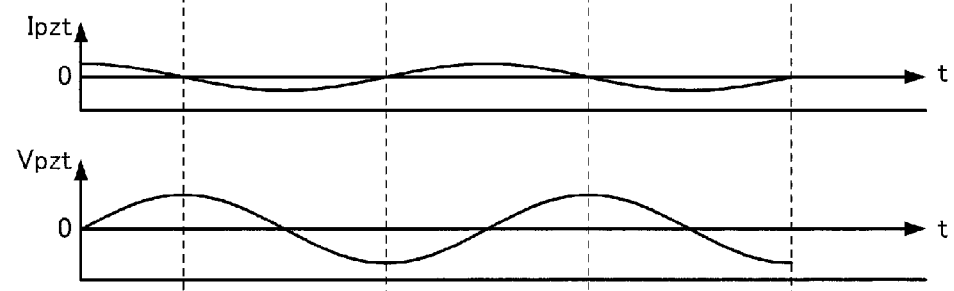
Figure 17C:
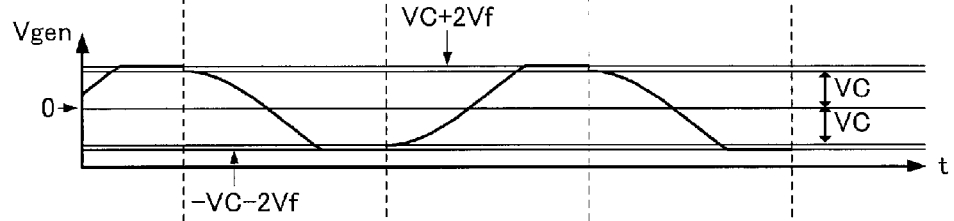
Figure 17D:
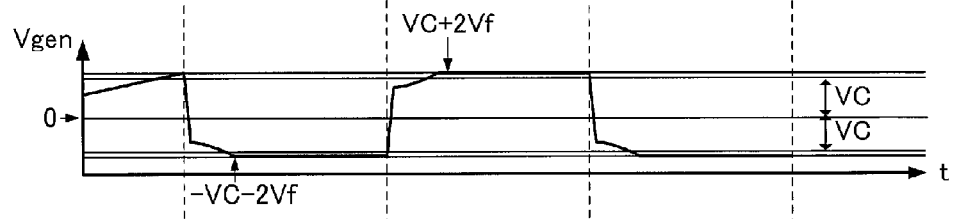
Figure 17E:
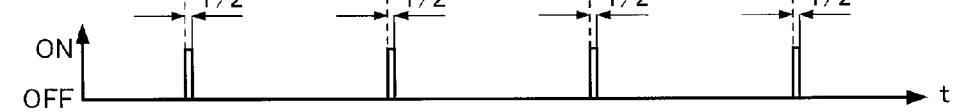

FIG. 17(a) illustrates the displacement of the beam 104. In addition, FIG. 17(b) illustrates a situation of a change in the current Ipzt and the electromotive force Vpzt generated by the piezoelectric element 108 according to the vibration of the beam 104. In addition, FIG. 17(c) illustrates a situation of a change in the voltage Vgen of the piezoelectric element 108 in the state where it is supposed that the switch SW is always turned OFF, and FIG. 17(d) illustrates a situation of a change in the voltage Vgen of the piezoelectric element 108 in the case where the switch SW is actually turned ON at the timing indicated by a broken line. In addition, FIG. 17(e) illustrates the turning ON/OFF states of the switch SW in the case where the switch SW is turned ON at the timing indicated by a broken line.

As illustrated, if the displacement of the beam 104 is increased in the positive direction, the voltage Vgen of the piezoelectric element 108 is clamped at a potential (VC+2 Vf) of the sum of the potential VC of the plus terminal of the capacitor C1, the forward drop voltage Vf of the diode D1, and the forward drop voltage Vf of the diode D4.

Similarly, if the displacement of the beam 104 is increased in the negative direction, the voltage Vgen of the piezoelectric element 108 is clamped at a potential (−VC−2 Vf) of the sum of the potential VC of the plus terminal of the capacitor C1, the forward drop voltage Vf of the diode D2, and the forward drop voltage Vf of the diode D3.

In addition, at the timing when the magnitude of the displacement of the beam 104 is at a peak (that is, the timing when the deformation direction of the beam 104 is switched), the direction of the current Ipzt generated by the piezoelectric element 108 is reversed. For example, if the magnitude of the displacement of the beam 104 is at a peak in the state where a positive electromotive force is generated by the piezoelectric element 108, the current Ipzt which has been flowed in the positive direction is reversed to the negative direction. Therefore, the current which has been flowed in the diode D1 is not flowed, so that the value of the voltage Vgen is lower than VC+2 Vf.

Therefore, the timing when the deformation direction of the beam 104 is switched from positive to negative (the timing when the displacement of the beam 104 is at a positive peak) is coincident with the timing when the voltage Vgen of the piezoelectric element 108 is decreased. Similarly, the timing when the deformation direction of the beam 104 is switched from negative to positive (the timing when the displacement of the beam 104 is at a negative peak) is coincident with the timing when the voltage Vgen of the piezoelectric element 108 is increased. Therefore, as illustrated in FIG. 16, the controller (the control circuit 114) allows the switch SW to be turned ON only for a predetermined time interval (for example, the time of ½ of the resonance period T of the LC resonance circuit) indicated by a broken line in FIG. 17(e) from the timing when it is detected by using the voltage detection circuit 140 that the voltage Vgen of the piezoelectric element 108 starts to be decreased or the timing when it is detected that the voltage Vgen of the piezoelectric element 108 starts to be increased, so that it is possible to periodically repeat the connection and disconnection between the piezoelectric element 108 and the inductor L at an appropriate timing which is synchronized with the deformation member (the beam 104). Accordingly, it is possible to efficiently store the charges in the piezoelectric element 108.

The controller (control circuit 114) may allow the switch SW to be connected at a time when the state changes from a constant state, where the voltage Vgen of the piezoelectric member detected by the voltage detection circuit 140 is clamped at (VC+2 Vf) or (−VC−2 Vf), into a state where the voltage Vgen of the piezoelectric member is equal to or higher than the reference voltage. More specifically, the controller may allow the switch SW to be connected at a time when a voltage difference of the piezoelectric member before and after a predetermined time has elapsed is switched from a state where the voltage difference is zero into a state where the voltage difference is equal to or higher than the reference voltage. Therefore, it is possible to periodically repeat the connection and disconnection of the piezoelectric element 108 and the inductor L at the timing synchronized with the deformation state (vibration state) of the deformation member (beam 104).

Figure 18:
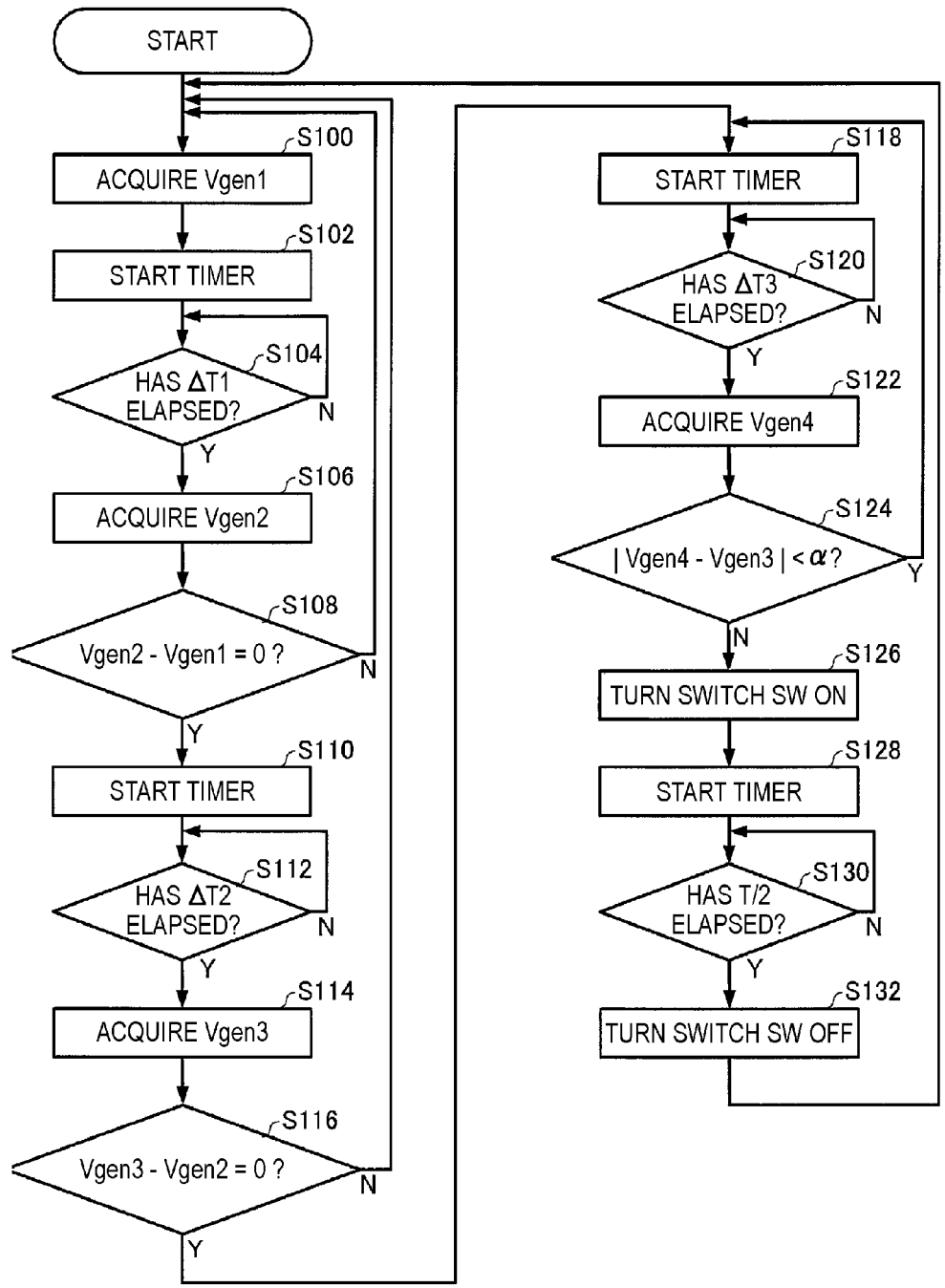
FIG. 18 is a flowchart illustrating a switch control process of switching the turning OF/OFF of a switch SW in a third modified example.

FIG. 18 is a flowchart illustrating a switch control process of switching the turning ON/OFF of the switch SW in the third modified example. This process is executed, for example, by a CPU embedded in the control circuit 114. In addition, hereinafter, the case where a predetermined time interval is the time of ½ of the resonance period T of the resonance circuit configured with the capacitive component C0 of the piezoelectric element 108 and the inductor L is described as an example.

In the switch control process illustrated in FIG. 18, first, the control circuit 114 acquires data of the voltage Vgen1 of the piezoelectric element 108 detected by the voltage detection circuit 140 (Step S100). After Step S100, the control circuit 114 allows a timer (not shown) embedded in the control circuit 114 to start (Step S102). After Step S102, the control circuit 114 determines whether or not a time ΔT1 elapses (Step S104). In the case where it is determined by the control circuit 114 that the time ΔT1 does not elapse (N in Step S104), the control circuit 114 repeats Step S104 until the timer indicates that the time ΔT1 elapses. In the case where it is determined by the control circuit 114 that the time ΔT1 elapses (Y in Step S104), the control circuit 114 acquires data of the voltage Vgen2 of the piezoelectric element 108 detected by the voltage detection circuit 140 (Step S106).

After Step S106, the control circuit 114 determines whether or not the difference between the voltages Vgen1 and Vgen2 of the piezoelectric element 108 is zero (Step S108). More specifically, the control circuit 114 calculates Vgen2−Vgen1, and in the case where the absolute value of Vgen2−Vgen1 is lower than a reference value, it is determined that the difference between the voltages Vgen1 and Vgen2 is zero. The reference value is set to be equal to or lower than the maximum value of the forward drop voltage Vf of the diode. In the case where it is determined by the control circuit 114 that the difference between the voltages Vgen1 and Vgen2 is not zero (N in Step S108), the control circuit 114 performs Step S100. In the case where it is determined by the control circuit 114 that the difference between the voltages Vgen1 and Vgen2 is zero (Y in Step S108), the control circuit 114 allows a timer (not shown) embedded in the control circuit 114 to start (Step S110).

After Step S110, the control circuit 114 determines whether or not a time ΔT2 elapses (Step S112). In the case where it is determined by the control circuit 114 that the time ΔT2 does not elapse (N in Step S112), the control circuit 114 repeats Step S112 until the timer indicates that the time ΔT2 elapses. In the case where it is determined by the control circuit 114 that the time ΔT2 elapses (Y in Step S112), the control circuit 114 acquires data of the voltage Vgen3 of the piezoelectric element 108 detected by the voltage detection circuit 140 (Step S114).

After Step S114, the control circuit 114 determines whether or not the difference between the voltages Vgen2 and Vgen3 of the piezoelectric element 108 is zero (Step S116). More specifically, the control circuit 114 calculates Vgen3−Vgen2, in the case where the absolute value of Vgen3−Vgen2 is lower than a reference value, it is determined that the difference between the voltages Vgen2 and Vgen3 is zero. The reference value is set to be equal to or lower than the maximum value of the forward drop voltage Vf of the diode. In the case where it is determined by the control circuit 114 that the difference between the voltages Vgen2 and Vgen3 is not zero (N in Step S116), the control circuit 114 performs Step S100. In the case where the control circuit 114 determines that the voltage difference between Vgen2 and Vgen3 is zero (Y in Step S116), the control circuit 114 determines that Vgen3 is an extreme value and starts the timer (not shown) built into the control circuit 114 (Step S118).

After Step S118, the control circuit 114 determines whether or not a time ΔT3 elapses (Step S120). In the case where it is determined by the control circuit 114 that the time ΔT3 does not elapse (N in Step S120), the control circuit 114 repeats Step S120 until the timer indicates that the time ΔT3 elapses. In the case where it is determined by the control circuit 114 that the time ΔT3 elapses (Y in Step S120), the control circuit 114 acquires voltage data Vgen4 of the piezoelectric element 108 detected by the voltage detection circuit 140 (Step S122).

After Step S122, the control circuit 114 determines whether or not an absolute value of a voltage difference between Vgen4 and Vgen3 of the piezoelectric member 108 is lower than a reference voltage α (Step S124). In the case where the control circuit 114 determines that the absolute value of the voltage difference between Vgen3 and Vgen4 is equal to or higher than the reference voltage α (Y in Step S124), the control circuit 114 performs Step S118. In the case where the control circuit 114 determines that the absolute value of the voltage difference between Vgen3 and Vgen4 is lower than the reference voltage a (N in Step S124), the control circuit 114 controls the switch SW to be turned ON (Step S126).

In the example illustrated in FIG. 18, by taking into consideration the case where the voltage difference of the piezoelectric member 108 accidentally becomes zero due to influence of noise or the like, in the case where both Vgen2−Vgen1 and Vgen3−Vgen2 are zero, it is determined that the voltage Vgen of the piezoelectric member 108 is an extreme value. In the case where the reliability of the determination can be sufficiently secured in terms of the specification of the apparatus, the processes from Step S110 to Step S116 may be omitted.

After Step S126, the control circuit 114 allows a timer (not shown) embedded in the control circuit 114 to start (Step S128). After Step S128, the control circuit 114 determines whether or not the time (time T/2) of ½ of the resonance period T of the resonance circuit configured with the capacitive component C0 of the piezoelectric element 108 and the inductor L elapses (Step S130). In the case where it is determined by the control circuit 114 that the time T/2 does not elapse (N in Step S130), the control circuit 114 repeats Step S130 until the timer indicates that the time T/2 elapses. In the case where it is determined by the control circuit 114 that the time T/2 elapses (Y in Step S130), the control circuit 114 controls the switch SW to be turned OFF (Step S132). After Step S132, the aforementioned processes of Step S100 and the following steps are repetitively performed.

In this manner, if the turning ON/OFF of the switch SW is performed, at least since the voltage between the terminals of the piezoelectric element 108 can be boosted, it is possible to store the charges although the voltage of the capacitor C1 is increased.

In addition, in the flowchart illustrated in FIG. 18 and the later-described flowcharts illustrated in FIGS. 20 and 21, the time ΔT1, the time ΔT2, and the time ΔT3 are set as a value which is sufficiently shorter than a natural vibration period of the beam 104. Particularly, it is preferable that the time ΔT3 is set to a sufficiently short value. This is because it is possible to effectively increase the voltage if the control circuit 114 allows the switch SW to be connected at the moment when the direction of deformation of the piezoelectric member 108 is switched. For example, it is preferable that the time ΔT3 be set to a length which is equal to or shorter than 1/100 of the natural vibration period of the beam 104. The time ΔT1 and the time ΔT2 may be set to a time which is longer than the time ΔT3. The case where the voltage Vgen of the piezoelectric member 108 is constant for a long time is a case where the deformation of the beam 104 is large, and in this case, the effect of a large increase in voltage can be expected. On the other hand, the case where the voltage Vgen of the piezoelectric member 108 is constant only for a short time is a case where deformation of the beam 104 is small, and in this case, the effect of a large increase in voltage cannot be expected. Therefore, the time ΔT1 and the time ΔT2 may be set to a value which ranges from about 1/100 to about 10/100 of the natural vibration period. In this manner, the time ΔT1 and the time ΔT2 are set to large values, so that the amount of calculation of the control circuit 114 is decreased. Accordingly, power consumption of the control circuit 114 is reduced, so that it is possible to increase output power of the power generation unit 100.

E-4. Fourth Modified Example

Figure 19A:
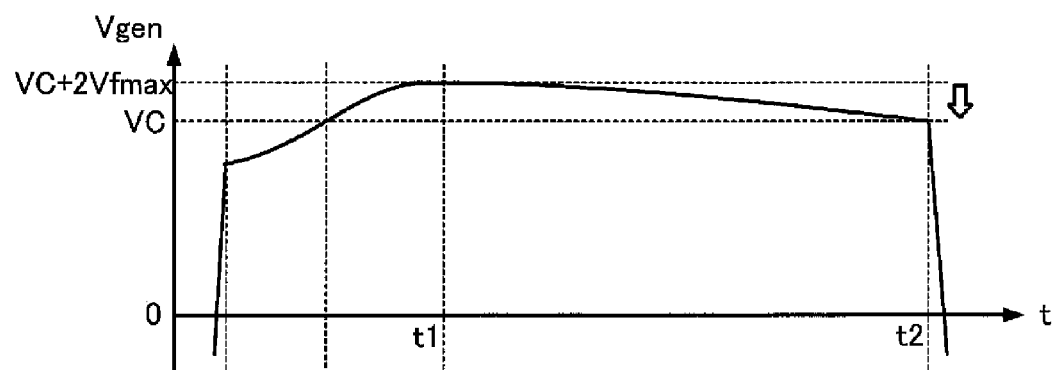
FIG. 19(*a*) is an enlarged partial graph of FIG. 17(*d*), and FIG. 19(*b*) is a graph illustrating a current flowing in a full bridge rectifier.
Figure 19B:
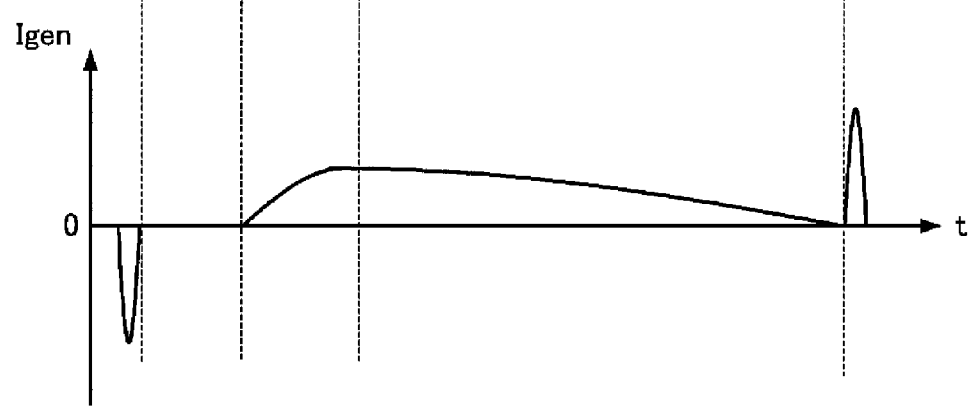

FIG. 19(a) is an enlarged partial graph of FIG. 17(d), and FIG. 19(b) is a graph illustrating a current Igen flowing in the full bridge rectifier 120.

The forward drop voltage Vf of the diode constituting the full bridge rectifier 120 is increased in proportion to an increase in an increase in forward current. Therefore, strictly speaking, the voltage VC+2 Vf at which the voltage Vgen of the piezoelectric member 108 is clamped is not constant. In the embodiment, the maximum value Vfmax of the forward drop voltage Vf of the diode is about 0.3V. In the example illustrated in FIG. 19(a), at the time point t1, that is, the time when the displacement of the beam 104 is zero, the voltage Vgen of the piezoelectric member 108 is VC+2 Vfmax.

As illustrated in FIG. 19(b), since the current flowing in the diode constituting the full bridge rectifier 120 is zero at the time when the direction of deformation of the beam 104 is switched over, the forward drop voltage of the diode is also zero. Therefore, as illustrated in FIG. 19(a), at the time point t2, that is, the time when the direction of deformation of the beam 104 is switched over, the voltage Vgen of the piezoelectric member 108 is VC.

Therefore, since the switch SW is allowed to be connected at the time when the voltage detected by the voltage detection circuit 140 is decreased by 2 Vfmax or more from the maximum value and at the time when the voltage detected by the voltage detection circuit 140 is increased by 2 Vfmax or more from the minimum value, the switch SW is allowed to be connected accurately at the time when the direction of deformation of the piezoelectric member 108 is switched over, so that it is possible to effectively store charges in the piezoelectric member 108.

In the case where a difference between the voltages Vgen detected by the voltage detection circuit 140 before and after a predetermined interval is equal to or lower than a reference voltage, the control circuit 114 may determine that the voltage Vgen detected by the voltage detection circuit 140 is an extreme value. Accordingly, it is possible to easily detect the time when the voltage Vgen detected by the voltage detection circuit 140 becomes an extreme value. Therefore, it is possible to appropriately detect the time when the direction of deformation of the beam 104 is switched over.

Figure 20:
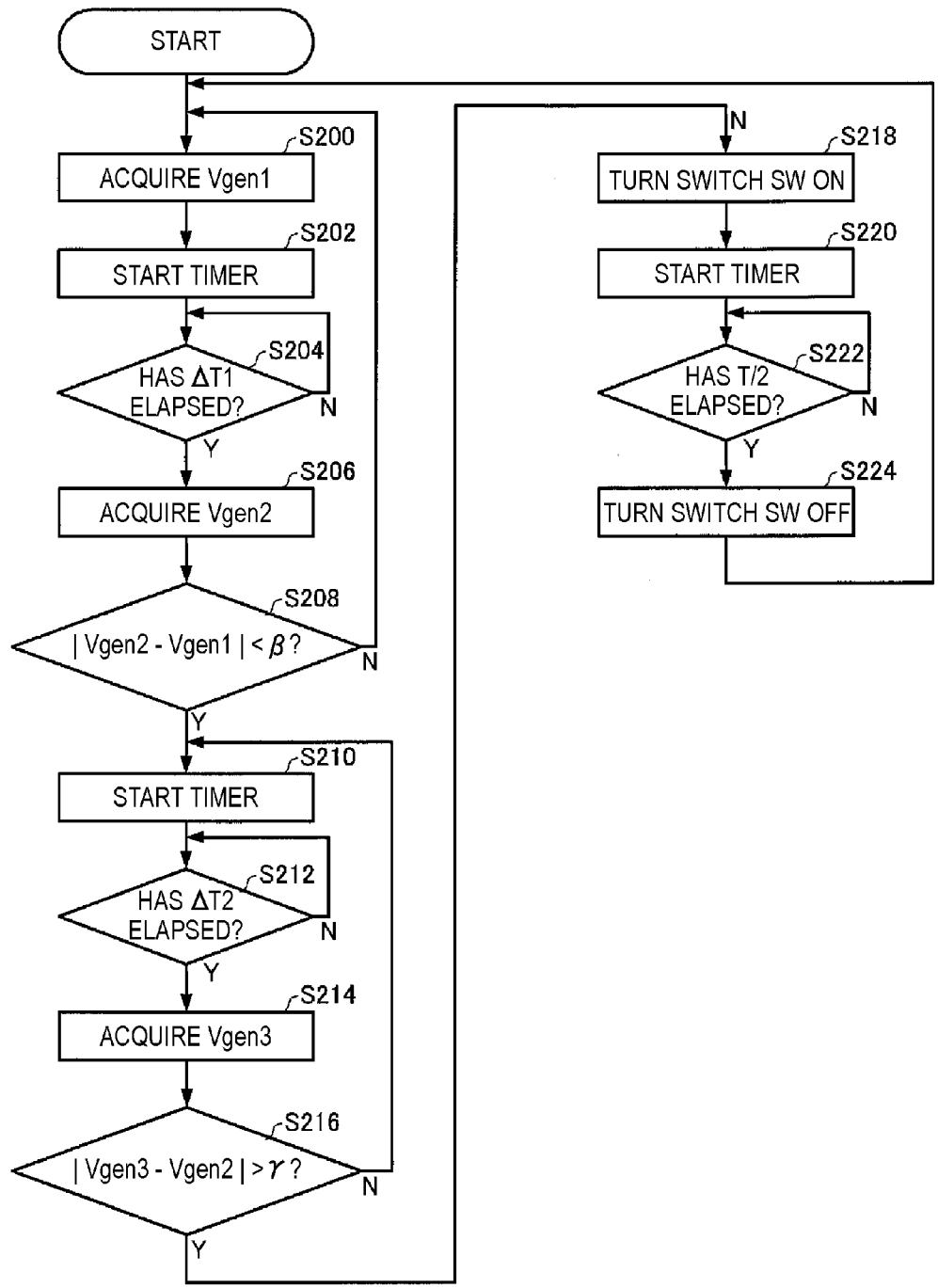
FIG. 20 is a flowchart illustrating a switch control process of switching over OF/OFF of a switch in a fourth modified example.

FIG. 20 is a flowchart illustrating a switch control process of switching over ON/OFF of the switch SW in the fourth modified example. The process is executed, for example, by a CPU built into the control circuit 114. In addition, hereinafter, a case where the predetermined time interval is a time which is ½ of a resonance period T of a resonance circuit configured to include a capacitive component Cg of the piezoelectric member 108 and an inductor L will be described as an example.

In the switch control process illustrated in FIG. 20, first the control circuit 114 acquires data of the voltage Vgen1 of the piezoelectric member 108 detected by the voltage detection circuit 140 (Step S200). After Step S200, the control circuit 114 starts a timer (not shown) built into the control circuit 114 (Step S202). After Step S202, the control circuit 114 determines whether or not a time ΔT1 has elapsed (Step S204). In the case where the control circuit 114 determines that the time ΔT1 has not elapsed (N in Step S204), the control circuit 114 repeats Step S204 until the time ΔT1 has elapsed in the timer. In the case where the control circuit 114 determines that the time ΔT1 has elapsed (Y in Step S204), the control circuit 114 acquires data of the voltage Vgen2 of the piezoelectric member 108 detected by the voltage detection circuit 140 (Step S206).

After Step S206, the control circuit 114 determines whether or not an absolute value of a voltage difference between Vgen1 and Vgen2 of the piezoelectric member 108 is lower than a reference voltage β (Step S208). In the embodiment, the reference voltage β is set to an appropriate value according to the time ΔT1. The reference voltage β may be set to a value of the following expression (1).

$$\beta < V\!f\mathrm{max} \times \Delta T1/T0 \quad (1)$$

In the case where the control circuit 114 determines that the absolute value of the voltage difference between Vgen1 and Vgen2 is equal to or higher than the reference voltage β (N in Step S208), the control circuit 114 performs Step S200. In the case where the control circuit 114 determines that the absolute value of the voltage difference between Vgen1 and Vgen2 is lower than the reference voltage β (Y in Step S208), the control circuit 114 determines that the voltage Vgen2 is an extreme value and starts the timer (not shown) built into the control circuit 114 (Step S210).

After Step S210, the control circuit 114 determines whether or not a time ΔT2 has elapsed (Step S212). In the case where the control circuit 114 determines that the time ΔT2 has not elapsed (N in Step S212), the control circuit 114 repeats Step S212 until the time ΔT2 has elapsed in the timer. In the case where the control circuit 114 determines that the time ΔT2 has elapsed (Y in Step S212), the control circuit 114 acquires data of the voltage Vgen3 of the piezoelectric member 108 detected by the voltage detection circuit 140 (Step S214).

After Step S214, the control circuit 114 determines whether or not an absolute value of a voltage difference between Vgen2 and Vgen3 of the piezoelectric member 108 is higher than a reference voltage γ (Step S216). In the case where the control circuit 114 determines that the absolute value of the voltage difference between Vgen2 and Vgen3 is equal to or lower than the reference voltage γ (N in Step S216), the control circuit 114 performs Step S210. In the embodiment, the reference voltage γ is set to a value which is equal to or lower than twice the maximum value Vfmax of the forward drop voltage Vf of the diode. In the case where the control circuit 114 determines that the absolute value of the voltage difference between Vgen2 and Vgen3 is higher than the reference voltage γ (Y in Step S216), the control circuit 114 controls the switch SW to be turned ON (Step S218).

After Step S218, the control circuit 114 starts a timer (not shown) built into the control circuit 114 (Step S220). After Step S220, the control circuit 114 determines whether or not a time (time T/2) which is ½ of a resonance period T of a resonance circuit configured to include a capacitive component Cg of the piezoelectric member 108 and an inductor L has elapsed (Step S222). In the case where the control circuit 114 determines that the time T/2 has not elapsed (N in Step S222), the control circuit 114 repeats Step S222 until the time T/2 has elapsed in the timer. In the case where the control circuit 114 determines that the time T/2 has elapsed (Y in Step S222), the control circuit 114 controls the switch SW to be turned OFF (Step S224). After Step S224, the processes after Step S200 described above are repeated.

In this manner, if the turning ON and OFF of the switch SW is performed, since at least the voltage between the terminals of the piezoelectric member 108 can be increased, it is possible to store charges even in the case where the voltage of the capacitor C1 is increased.

E-5. Fifth Modified Example

In the power generation unit 100, in the case where an absolute value of a differential value of the voltage Vgen detected by the voltage detection circuit 140 is equal to or lower than a reference value, the control circuit 114 may determine that the absolute value of the voltage Vgen detected by the voltage detection circuit 140 is an extreme value. Therefore, it is possible to easily detect the time when the absolute value of the voltage Vgen detected by the voltage detection circuit 140 is an extreme value. In addition, in comparison with the second embodiment, it is possible to more accurately detect the time when the absolute value of the voltage Vgen detected by the voltage detection circuit 140 is an extreme value. Accordingly, it is possible to appropriately detect the time when the direction of deformation of the beam 104 is switched over.

Figure 21:
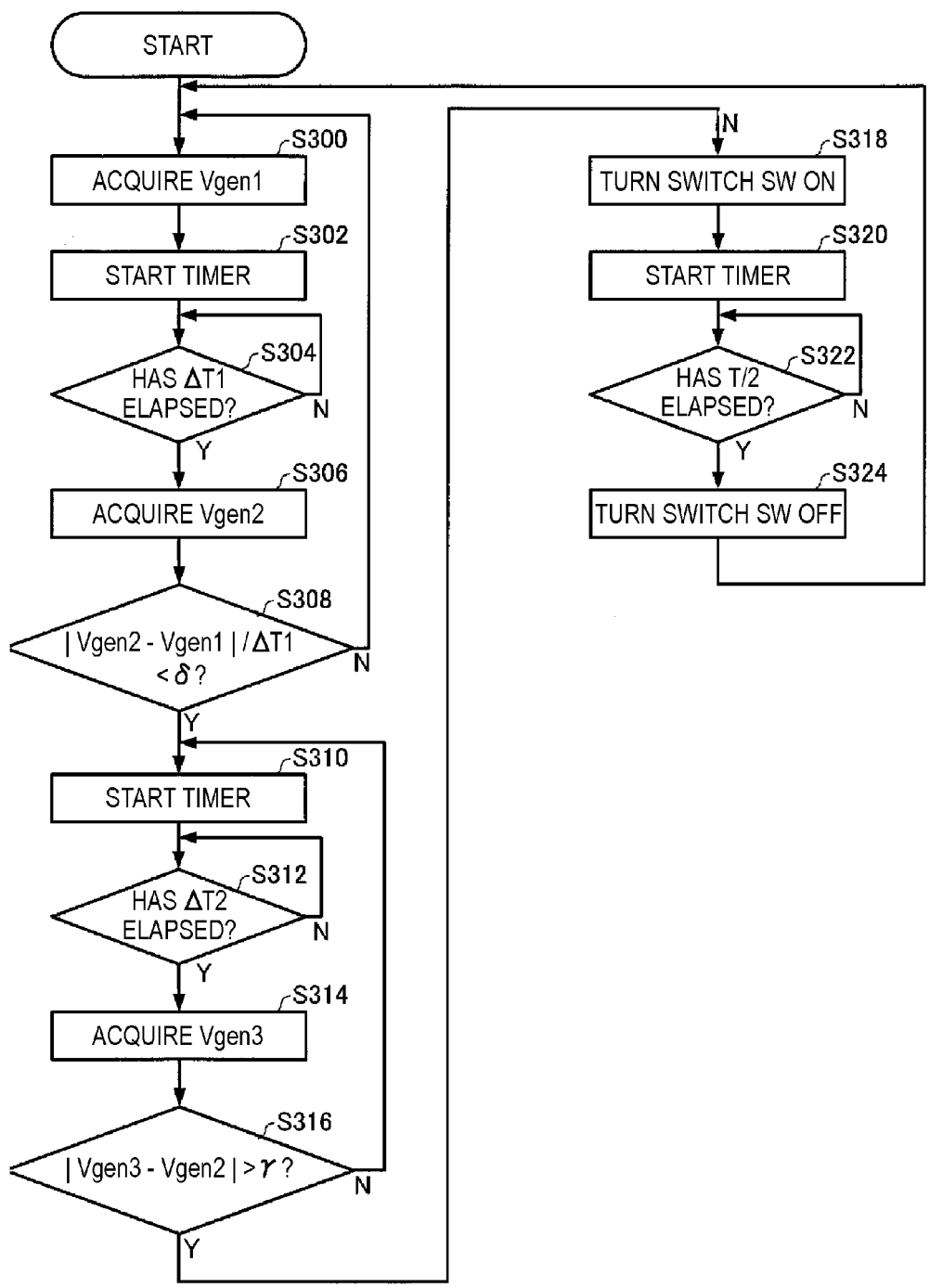
FIG. 21 is a flowchart illustrating a switch control process of switching over OF/OFF of a switch SW in a fifth modified example.

FIG. 21 is a flowchart illustrating a switch control process of switching over ON and OFF of the switch SW in the fifth modified example. The process is executed, for example, by a CPU built into the control circuit 114. In addition, hereinafter, a case where the predetermined time interval is a time which is ½ of a resonance period T of a resonance circuit configured to include a capacitive component Cg of the piezoelectric member 108 and an inductor L will be described as an example.

In the switch control process illustrated in FIG. 21, first, the control circuit 114 acquires data of the voltage Vgen1 of the piezoelectric member 108 detected by the voltage detection circuit 140 (Step S300). After Step S300, the control circuit 114 starts a timer (not shown) built into the control circuit 114 (Step S302). After Step S302, the control circuit 114 determines whether or not a time ΔT1 has elapsed (Step S304). In the case where the control circuit 114 determines that the time ΔT1 has not elapsed (N in Step S304), the control circuit 114 repeats Step S304 until the time ΔT1 has elapsed in the timer. In the case where the control circuit 114 determines that the time ΔT1 has elapsed (Y in Step S304), the control circuit 114 acquires data of the voltage Vgen2 of the piezoelectric member 108 detected by the voltage detection circuit 140 (Step S306).

After Step S306, the control circuit 114 determines whether or not a value obtained by dividing an absolute value of a voltage difference between Vgen1 and Vgen2 of the piezoelectric member 108 by ΔT1 is lower than a reference value δ (Step S308). The reference value δ may be set to a value of the following expression (2).

$$\delta < Vfmax \times \Delta T1 \qquad (2)$$

In the embodiment, the reference value δ is set to an appropriate value according to the time ΔT1. In the case where the control circuit 114 determines that the value obtained by dividing the absolute value of the voltage difference between Vgen1 and Vgen2 by ΔT1 is equal to or higher than the reference value δ (N in Step S308), the control circuit 114 performs Step S200. In the case where the control circuit 114 determines that the value obtained by dividing the absolute value of the voltage difference between Vgen1 and Vgen2 by ΔT1 is lower than the reference value δ (Y in Step S308), the control circuit 114 determines that the voltages Vgen2 is an extreme value and starts the timer (not shown) built into the control circuit 114 (Step S310).

After Step S310, the control circuit 114 determines whether or not a time ΔT2 has elapsed (Step S312). In the case where the control circuit 114 determines that the time ΔT2 has not elapsed (N in Step S312), the control circuit 114 repeats Step S312 until the time ΔT2 has elapsed in the timer. In the case where the control circuit 114 determines that the time ΔT2 has elapsed (Y in Step S312), the control circuit 114 acquires data of the voltage Vgen3 of the piezoelectric member 108 detected by the voltage detection circuit 140 (Step S314).

After Step S314, the control circuit 114 determines whether or not an absolute value of a voltage difference between Vgen2 and Vgen3 of the piezoelectric member 108 is higher than a reference voltage γ (Step S316). In the case where the control circuit 114 determines that the absolute value of the voltage difference between Vgen2 and Vgen3 is equal to or lower than the reference voltage γ (N in Step S316), the control circuit 114 performs Step S310. In the embodiment, the reference voltage γ is set to a value which is equal to or lower than twice the maximum value Vfmax of the forward drop voltage Vf of the diode. In the case where the control circuit 114 determines that the absolute value of the voltage difference between Vgen2 and Vgen3 is higher than the reference voltage γ (Y in Step S316), the control circuit 114 controls the switch SW to be turned ON (Step S318).

After Step S318, the control circuit 114 starts a timer (not shown) built into the control circuit 114 (Step S320). After Step S320, the control circuit 114 determines whether or not a time (time T/2) which is ½ of a resonance period T of a resonance circuit configured to include a capacitive component Cg of the piezoelectric member 108 and an inductor L has elapsed (Step S322). In the case where the control circuit 114 determines that the time T/2 has not elapsed (N in Step S322), the control circuit 114 repeats Step S322 until the time T/2 has elapsed in the timer. In the case where the control circuit 114 determines that the time T/2 has elapsed (Y in Step S322), the control circuit 114 controls the switch SW to be turned OFF (Step S324). After Step S324, the processes after Step S300 described above are repeated.

In this manner, if the turning ON and OFF of the switch SW is performed, since at least the voltage between the terminals of the piezoelectric member 108 can be increased, it is possible to store charges even in the case where the voltage of the capacitor C1 is increased.

F. Electronic Apparatus, Transportation Unit and Battery

Figure 22:
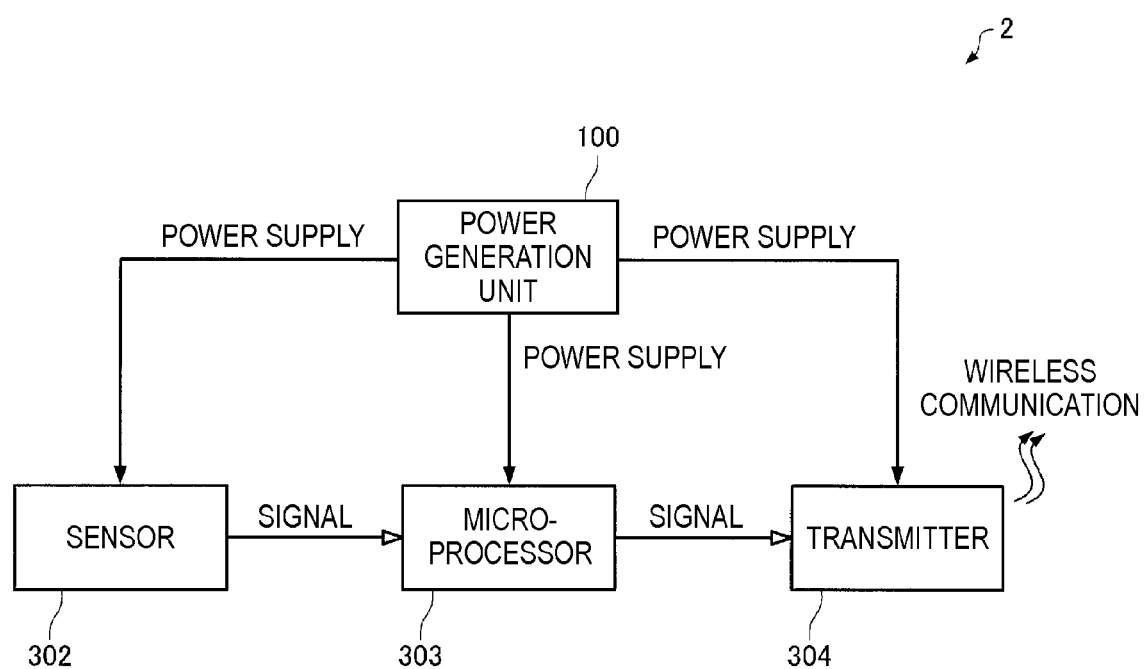
FIG. 22 is a diagram illustrating an electrical structure of an example of an electronic apparatus including a power generation unit 100.

FIG. 22 is a diagram illustrating an electrical structure of an example of an electronic apparatus 2 including the power generation unit 100. The electronic apparatus 2 is used as a sensor node for structure health monitoring for determining integrity of a structure. The electronic apparatus 2 is configured to include a sensor 302, a microprocessor 303 which collects data output by the sensor 302, and a transmitter 304 which transmits the data collected by the microprocessor 30 in a wireless manner. As the sensor 302, used is an acceleration sensor for the purpose of monitoring vibration of the structure. The power generation unit 100 supplies power to the sensor 302, the microprocessor 303, and the transmitter 304.

Since the electronic apparatus 2 illustrated in FIG. 22 is used in the state where it is buried in concrete or the like of the structure, it is very difficult to perform maintenance such as battery replacement and charging. However, since the electronic apparatus 2 includes the power generation unit 100 capable of generating power by using vibration of the structure, the maintenance is unnecessary, and it can operate semi-permanently.

In addition, the electronic apparatus 2 may include the power generation unit 100a instead of the power generation unit 100. In this case, it is also possible to obtain the same effects.

In addition, since the power generation unit according to the invention generates power according to the vibration or movement, if the power generation unit is installed at a bridge, a building, a landslide side, or the like, the power generation unit generates power at the time of accident such as earthquake, and thus, power can be supplied to a network apparatus such as an electronic apparatus only at the necessary time (at the time of accident).

In addition, since the power generation unit according to the invention can be miniaturized, the invention is not limited to the electronic apparatus, but the power generation unit can be installed in all kinds of apparatuses. For example, the power generation unit according to the invention is used for a transportation unit (transportation apparatus) such as an automobile, a bicycle, an electric train, or an airplane, so that it is possible to effectively supply power to an apparatus included in the transportation unit.

At this time, in order to cope with all types of vibration, a plurality of the power generation unites 100 which are different in length of the beam 104 or in weight of the mass 106 may be integrated with the transportation unit. For example, a plurality of the power generation unites 100 may be configured as a generating unit which is fixed to a common supporting end 102.

In addition, the power generation unit according to the invention as a substitute for a battery or as a supplementary battery may be assembled into a small-sized electronic apparatus such as a remote controller.

In addition, instead of being installed in a specific apparatus or the like, the power generation unit according to the invention may be configured as a battery having the same shape as that of, for example, a button battery or a dry battery so as to be used for a general electronic apparatus. At this time, since the charges can be stored in the capacitor according to the vibration, the power generation unit according to the invention may be used as a battery even at the time of accident when power is lost. In addition, since the power generation unit according to the invention has a lifetime longer than that of a primary cell, it is possible to reduce environmental load in terms of lifecycle.

Hereinbefore, although embodiments or modified examples are described, the invention is not limited to these embodiments or modified examples, but various aspects can be embodied within a scope without departing from the spirit of the invention.

For example, in the embodiment described above, it is described that the piezoelectric element 108 is attached to the beam 104 having a cantilever structure. However, any member which is easily repetitively deformed according to vibration or the like may be used as the member to which the piezoelectric element 108 is attached. For example, the piezoelectric element 108 may be attached to a surface of a thin film, or the piezoelectric element 108 may be attached to a side surface of a helical spring.

The invention includes configurations substantially the same as the configurations of the embodiments (for example, a configurations having the same function, method, and result or a configuration having the same purpose and effect). In addition, the invention includes a configuration where non-essential portions of the configuration described in the embodiment are replaced. In addition, the invention includes a configuration by which the same function and effects of the configuration described in the embodiment can be obtained or a configuration by which the same purpose can be achieved. In addition, the invention includes a configuration where a well-known technique is added to the configuration described in the embodiment.

This application claims priority to Japanese Patent Application No. 2011-103446, filed on May 6, 2011, Application No. 2011-219144, filed on Oct. 3, 2011, Application No. 2012-102879, filed on Apr. 27, 2012, the entirety of which is hereby incorporated by reference.

The invention claimed is:

1. A power generation unit comprising:
a deformation member which is deformed by switching a deformation direction;
a piezoelectric element which is installed to the deformation member;
a pair of electrodes which are installed to the piezoelectric element;
an inductor which is installed between the pair of the electrodes and which together with a capacitive component of the piezoelectric element constitutes a resonance circuit;
a switch which is connected in series to the inductor;
a rectifier which is installed between the pair of the electrodes to rectify an AC current generated by the piezoelectric element;
a voltage detection circuit which detects potentials of an anode and cathode of a diode included in the rectifier; and
a controller which allows the switch to be in an ON state for a predetermined time interval based on an output signal of the voltage detection circuit.

2. The power generation unit according to claim 1, wherein the controller allows the switch to be connected when the potential of the anode of the diode becomes equal to or lower than the potential of the cathode after the potential of the anode of the diode is higher than the potential of the cathode, and after that, the controller allows the switch to be disconnected if the predetermined time interval elapses.

3. The power generation unit according to claim 1, wherein the rectifier allows the AC current generated by the piezoelectric element to exclusively be flowed in first and fourth diodes or third and second diodes according to a polarity of the AC current, and
wherein the controller allows the switch to be in the ON state for the predetermined time interval based on potentials of the anode and cathode of the first or fourth diode and potentials of the anode and cathode of the third or second diode.

4. The power generation unit according to claim 1, wherein the controller allows the switch to be in the ON state by setting a time corresponding to a half period of a resonance period of the resonance circuit as the predetermined time interval.

5. A power generation unit comprising:
a piezoelectric member which is formed by using a piezoelectric element;
a pair of electrodes which are installed in the piezoelectric member;
a deformation member which repeatedly deforms the piezoelectric member;
an inductor which is installed between the pair of electrodes and which, together with a capacitive component of the piezoelectric member, constitutes a resonance circuit;
a switch which is serially connected to the inductor;
a rectifier which is installed between the pair of electrodes and which rectifies an AC current generated by the piezoelectric member;
a capacitor which stores an output current of the rectifier;
a voltage detection unit which detects a voltage of the piezoelectric member; and
a controller which determines whether a first voltage detected by the voltage detection unit is a maximum value or a minimum value,
wherein in the case where it is determined that the first voltage is the maximum value, and a second voltage detected by the voltage detection unit after detection of the first voltage is decreased from the maximum value to a value which is equal to or higher than a reference voltage, the controller allows the switch to be connected, and
wherein in the case where it is determined that the first voltage is the minimum value, and the second voltage detected by the voltage detection unit after detection of the first voltage is increased from the minimum value to a value which is equal to or higher than the reference voltage, the controller allows the switch to be connected.

6. The power generation unit according to claim 5,
wherein the rectifier is a full bridge rectifier including a diode, and
wherein the reference voltage is a value which is equal to or lower than twice a forward drop voltage value of the diode.

7. An electronic apparatus using the power generation unit according to claim 1.

8. A transportation unit using the power generation unit according to claim 1.

9. A battery using the power generation unit according to claim 1.

10. A control method of a power generation unit including:
a deformation member which is deformed by switching a deformation direction;

a piezoelectric element which is installed to the deformation member;
a pair of electrodes which are installed to the piezoelectric element;
an inductor which is installed between the pair of the electrodes and which together with a capacitive component of the piezoelectric element constitutes a resonance circuit;
a switch which is connected in series to the inductor;
a rectifier which rectifies an AC current generated by the piezoelectric element;
the method comprising:
detecting anode and cathode potentials of a diode included in the rectifier; allowing the switch to be in an ON state for a predetermined time interval based on a detection result of the anode and cathode potentials of the diode.

11. A power generation unit comprising:
a first electrode;
a second electrode;
a piezoelectric member which is disposed between the first and second electrodes and which includes a piezoelectric element;
a deformation member which applies a mechanical force to the piezoelectric member;
an inductor which, together with a capacitive component of the piezoelectric member, constitutes a resonance circuit;
a switch which is serially connected to the inductor;
a rectifier which is electrically connected to the piezoelectric member and which rectifies an AC current generated by the piezoelectric member;
a capacitor which stores an output current of the rectifier;
a voltage detection unit which detects a voltage generated by the piezoelectric member; and
an inductor which is electrically connected to the first or second electrode.

12. The power generation unit according to claim 1, wherein the inductor together with a capacitive component of the piezoelectric member constitutes a resonance circuit.

* * * * *